United States Patent
Oikawa

(10) Patent No.: US 11,171,083 B2
(45) Date of Patent: Nov. 9, 2021

(54) SEMICONDUCTOR DEVICE

(71) Applicant: RENESAS ELECTRONICS CORPORATION, Tokyo (JP)

(72) Inventor: Ryuichi Oikawa, Tokyo (JP)

(73) Assignee: RENESAS ELECTRONICS CORPORATION, Tokyo (JP)

(*) Notice: Subject to any disclaimer, the term of this patent is extended or adjusted under 35 U.S.C. 154(b) by 100 days.

(21) Appl. No.: 16/594,936

(22) Filed: Oct. 7, 2019

(65) Prior Publication Data

US 2020/0144177 A1 May 7, 2020

(30) Foreign Application Priority Data

Nov. 7, 2018 (JP) ............................. JP2018-209533

(51) Int. Cl.
  *H01L 23/66* (2006.01)
  *H01L 23/522* (2006.01)
  *H01L 49/02* (2006.01)

(52) U.S. Cl.
  CPC .......... *H01L 23/5223* (2013.01); *H01L 23/66* (2013.01); *H01L 28/40* (2013.01); *H01L 2223/6611* (2013.01); *H01L 2223/6672* (2013.01)

(58) Field of Classification Search
  None
  See application file for complete search history.

(56) References Cited

U.S. PATENT DOCUMENTS

| 6,115,262 A * | 9/2000 | Brunner ............... H05K 3/3442 361/774 |
| 10,056,323 B2 | 8/2018 | Nakagawa et al. |
| 2010/0177489 A1* | 7/2010 | Yagisawa ................ H01P 3/081 361/752 |
| 2012/0098091 A1* | 4/2012 | Ikemoto ............ H01L 23/49822 257/532 |
| 2018/0019194 A1* | 1/2018 | Papillon .................. H01L 25/04 |
| 2019/0246495 A1* | 8/2019 | Kawazu .................. H01L 23/12 |
| 2020/0337150 A1* | 10/2020 | Kawazu ............... H05K 1/0251 |

FOREIGN PATENT DOCUMENTS

WO 2015/162768 A1 10/2015

\* cited by examiner

*Primary Examiner* — Benjamin P Sandvik
(74) *Attorney, Agent, or Firm* — McDermott Will & Emery LLP

(57) ABSTRACT

By changing the characteristic impedance of the transmission line depending on the location, the transmission line functions as a band-pass filter.

20 Claims, 37 Drawing Sheets

TL1 : Transmission line
TL2 : Transmission line

SEMICONDUCTOR DEVICE

CROSS-REFERENCE TO RELATED APPLICATIONS

The disclosure of Japanese Patent Application No. 2018-209533 filed on Nov. 7, 2018 including the specification, drawings and abstract is incorporated herein by reference in its entirety.

BACKGROUND OF THE INVENTION

The present invention relates to a semiconductor device, and, for example, the present invention relates to a technique useful for application to the semiconductor device including a DC cut-off capacitor (DC-blocking capacitor). In International Patent Publication No. 2015-162768, there is disclosed a technique of mounting the DC cut-off capacitor on a wiring board.

SUMMARY THE INVENTION

For example, in the semiconductor device that performs high-speed signal transmission typified by 56 Gbps, when the DC cut-off capacitor is inserted into a signal wiring formed on the wiring board, a design technique that reduces parasitic capacitance of a pad on which the DC cut-off capacitor is mounted is used from the viewpoint of matching the characteristic impedance. However, as a result of examination by the present inventor, it has been found that in this design method, deterioration of signal characteristics in high-speed signal transmission is large, and it is difficult to obtain desired performance. Therefore, a design method capable of suppressing deterioration of signal characteristics even when the DC cut-off capacitor is inserted into the signal wiring formed on a wiring board is desired. Other objects and novel features will become apparent from the description of this specification and the accompanying drawings. The semiconductor device according to the embodiment comprises a pair of a first capacitor pad and a second capacitor pad on which a capacitive component is mounted, and the first capacitor pad is connected to the first wiring while the second capacitor pad is connected to the second wiring. At this time, the characteristic impedance of the first capacitor pad is smaller than the characteristic impedance of the first wiring, and the characteristic impedance of the second capacitor pad is smaller than the characteristic impedance of the second wiring. According to one embodiment, the performance of the semiconductor device can be improved.

DESCRIPTIONS OF THE PREFERRED EMBODIMENTS

Figure 1:
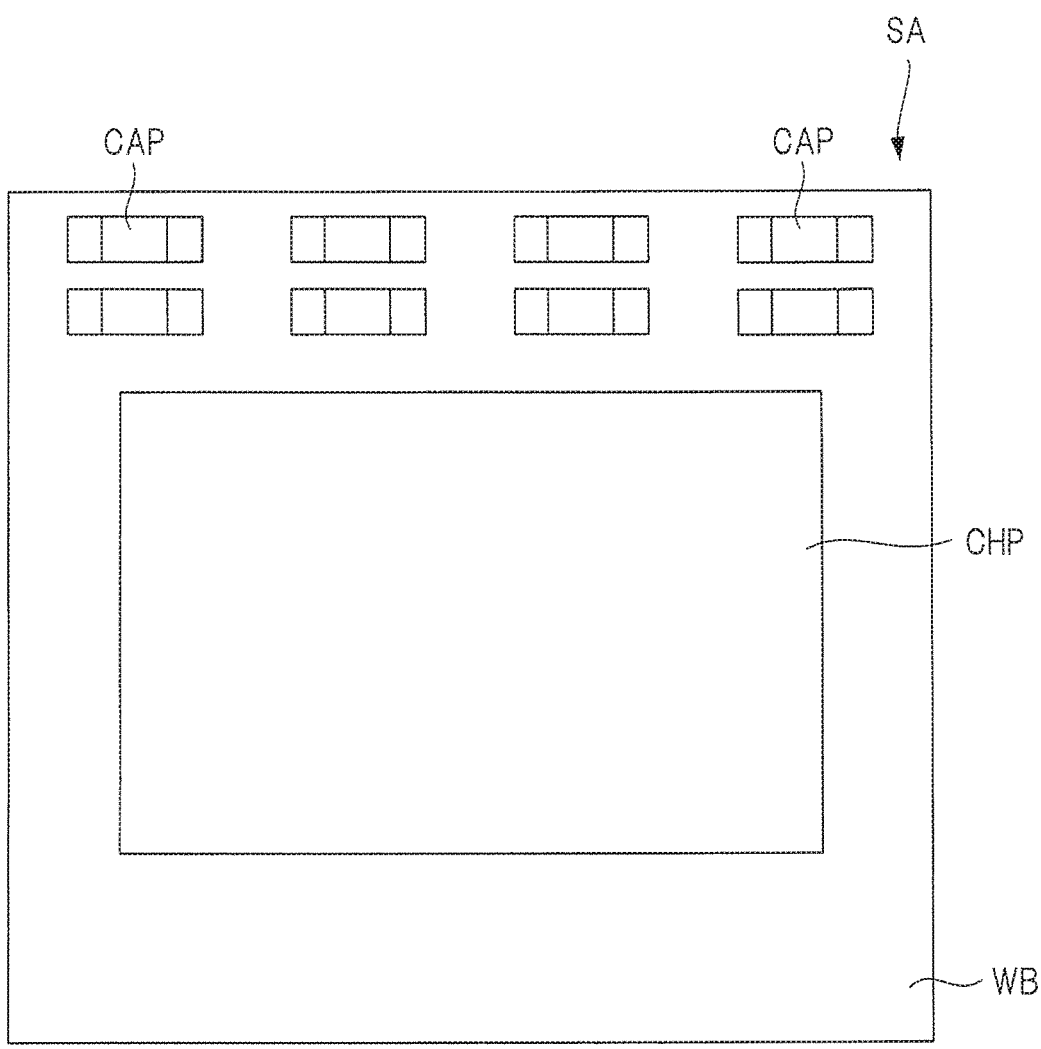
FIG. 1 is a plan view showing a schematic configuration of a semiconductor device according to Embodiment 1.

In the following embodiments, when it is necessary for convenience, the description will be made by dividing into a plurality of sections or embodiments, but except for the case specifically specified, these sections and embodiments are not independent of each other, and one of them is related to some or all of modifications, details, supplementary description, and the like of the other.

In the following embodiments, the number of elements, etc. (including the number of elements, numerical values, quantities, ranges, etc.) is not limited to the specific number, but may be not less than or equal to the specific number, except for cases where the number is specifically indicated and is clearly limited to the specific number in principle.

Furthermore, in the following embodiments, it is needless to say that the constituent elements (including element steps and the like) are not necessarily essential except in the case where they are specifically specified and the case where they are considered to be obviously essential in principle.

Similarly, in the following embodiments, when referring to the shapes, positional relationships, and the like of components and the like, it is assumed that the shapes and the like are substantially approximate to or similar to the shapes and the like, except for the case in which they are specifically specified and the case in which they are considered to be obvious in principle, and the like. The same applies to the above numerical values and ranges.

In all the drawings for explaining the embodiments, the same members are denoted by the same reference numerals in principle, and repetitive descriptions thereof are omitted. In order to make the drawings easy to understand, hatching may be used even in a plan view.

For example, a transmission line for signal transmission is provided between a transmission section for transmitting a signal and a reception section for receiving the signal. Usually, the optimum DC bias voltage applied to the transmitter and the optimum DC bias voltage applied to the receiver are different. For this reason, when the transmission section and the reception section are connected by the transmission line without interposing a DC cut-off capacitor, it becomes impossible to apply an optimum DC bias voltage to each of the transmission section and the reception section. Therefore, there is a need to provide a DC cut-off capacitor in the transmission line so that an optimum DC bias voltage different from each other can be applied to each of the transmission section and the reception section. That is, in the case where the DC blocking capacitor is not provided in the transmission line between the transmission section and the reception section, for example, the DC bias voltage applied to the transmission section is applied to the reception section via the transmission line, so that the optimum DC bias voltage cannot be applied to the reception section. On the other hand, if a DC cut-off capacitor is provided in the transmission line between the transmitting section and the receiving section, even if different DC bias voltages are applied to the transmitting section and the receiving section, the difference voltage between the different DC bias voltages is absorbed by the DC cut-off capacitor. Therefore, if a DC cut-off capacitor is provided in the transmission line between the transmission section and the reception section, it is possible to apply an optimum DC bias voltage to each of the transmission section and the reception section.

Further, the operation voltage of the transmitting unit and the operating voltage of the receiving unit may be different from each other. For example, when a semiconductor laser is provided in the receiving section, the operation voltage of the receiving section becomes greater than the operating voltage of the transmitting section. In this case, if the transmitting section and the receiving section are simply connected by a transmission line, a high operating voltage of the receiving section is applied to the transmitting section via the transmission line, and the transmitting section is destroyed.

As described above, it is necessary to provide a DC cut-off capacitor in the transmission line connecting the transmission section and the reception section. Here, if a configuration in which a DC cut-off capacitor is built in the semiconductor device in advance is used, a user who purchases the semiconductor device does not have to consider providing the DC cut-off capacitor, so that a user-friendly semiconductor device can be provided.

Therefore, in the following description, a semiconductor device having a built-in DC cut-off capacitor is taken as an example.

FIG. 1 is a plan view showing a schematic configuration of a semiconductor device in Embodiment 1.

In FIG. 1, the semiconductor device SA according to the Embodiment 1 has, for example, a wiring board WB having a rectangular planar shape, and a semiconductor chip CHP is mounted on the wiring board WB. In the semiconductor chip CHP, for example, an integrated circuit constituting a transmission section is formed. The transmission section formed on the semiconductor chip CHP is electrically connected with a transmission line formed on the wiring board WB. At this time, as shown in FIG. 1, a DC cut-off capacitor CAP is mounted on the wiring board WB, and the DC cut-off capacitor CAP is inserted into the transmission line formed on the wiring board WB.

Figure 2:
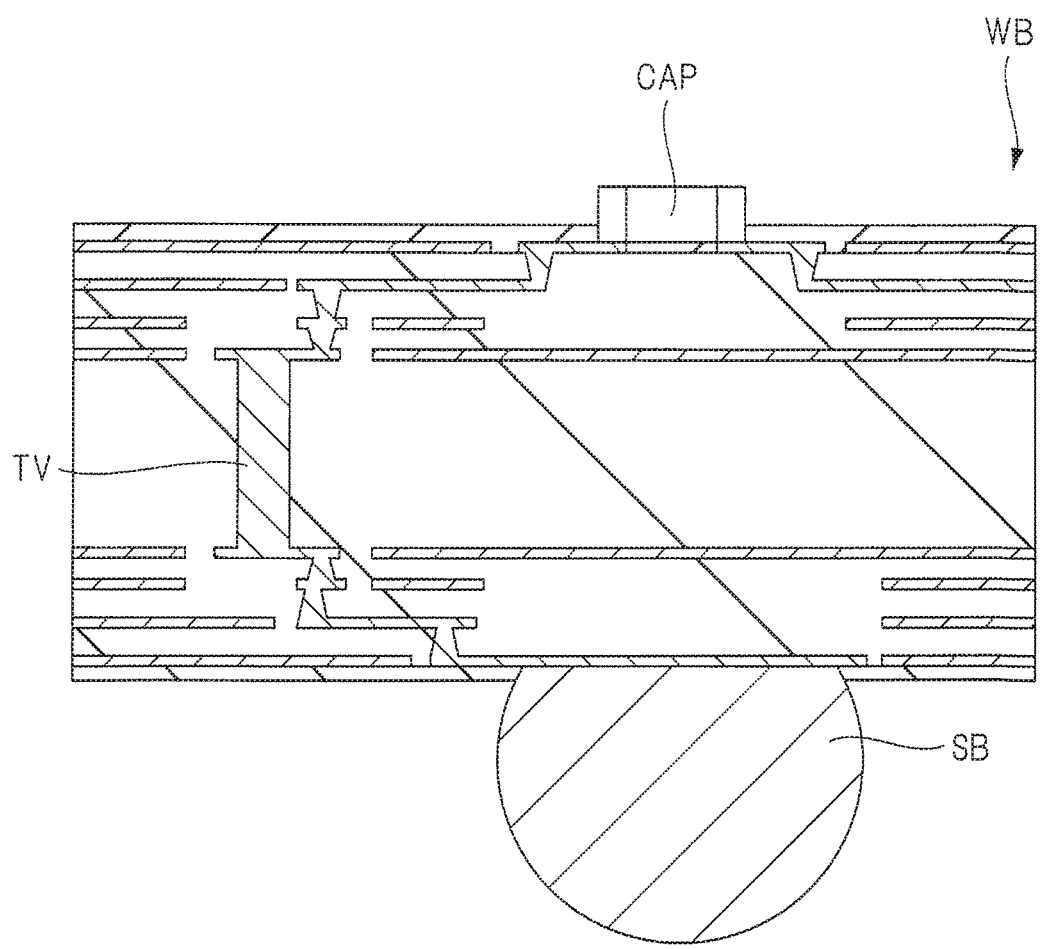
FIG. 2 is a cross-sectional view schematically showing a cross section of the wiring board.

FIG. 2 is a cross-sectional view schematically showing a cross section of the wiring board.

In FIG. 2, the DC blocking capacitor CAP mounted on an upper surface of the wiring board WB is electrically connected to the solder ball (external connection terminal) SB mounted on the back surface of the wiring board WB via an internal wiring formed inside the wiring board WB. At this time, as shown in FIG. 2, a through via TV is provided in the middle of the internal wiring formed in the wiring board WB, and this through via TV is arranged at a position not overlapping in plan with the DC blocking capacitor CAP mounted on the surface of the wiring board WB (more specifically, a capacitor pad mounting the DC blocking capacitor CAP). Therefore, the semiconductor device SA according to the Embodiment 1 can suppress electromagnetic interference between the capacitor pad and the through via TV, thereby improving the performance of the semiconductor device SA. That is, in the semiconductor device SA according to the Embodiment 1, since the influence of the mutual interference between the capacitor pad and the through via TV is reduced, it is possible to obtain an advantage that the electromagnetic structure design (layout) of the capacitor pad and the electromagnetic structural design (layout) of the through via TV can be easily optimized at the same time.

In the semiconductor device SA configured as described above, the DC cut-off capacitor CAP is mounted on the wiring board WB, but in order to suppress the characteristic deterioration of the transmission line in which the DC cut-off capacitor CAP is inserted, the mounting structure of the DC cut-off capacitor CAP (capacitor pad) becomes important. Therefore, in the following, a related art related to a mounting structure (capacitor pad) of the DC cut-off capacitor CAP will be described, and a room for improvement existing in this related art will be described.

The "related art" referred to in the present specification is a technology having a problem newly found by the inventor, and is not a known prior art, but is a technology described with the intention of a prerequisite technology (unknown technology) of a new technical idea, although it is not a known prior art.

Figure 3:
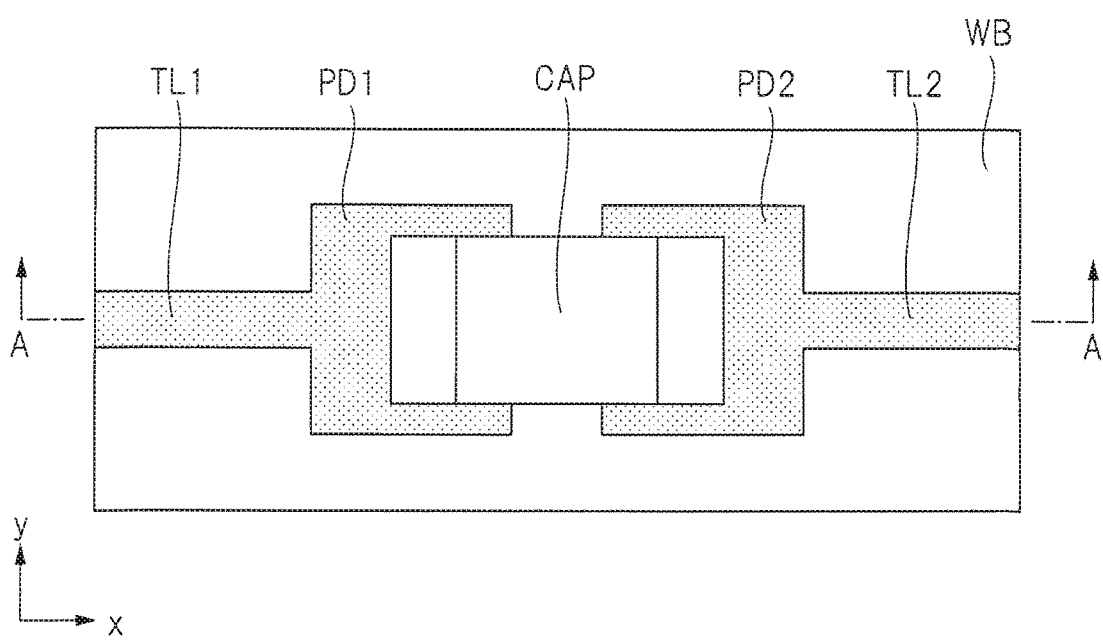
FIG. 3 is a plan view showing a mounting structure of a DC cut-off capacitor in the related art.

FIG. 3 is a plan view schematically showing a mounting structure of a DC cut-off capacitor in the related art.

In FIG. 3, for example, a transmission line TL1 extending in the x direction and a transmission line TL2 extending in the x direction are formed on the upper surface of the wiring board WB. A capacitor pad PD1 is formed at the end of the transmission line TL1, and a capacitor pad PD2 is formed at the end of the transmission line TL2. Here, the capacitor pad PD1 and the capacitor pad PD2 are arranged to face each other in a spaced-apart manner, and the DC cut-off capacitor CAP is mounted on the wiring board WB so as to be connected with both the capacitor pad PD1 and the capacitor pad PD2. As a result, the DC cut-off capacitor CAP is inserted between the transmission line TL1 and the transmission line TL2.

Figure 4:
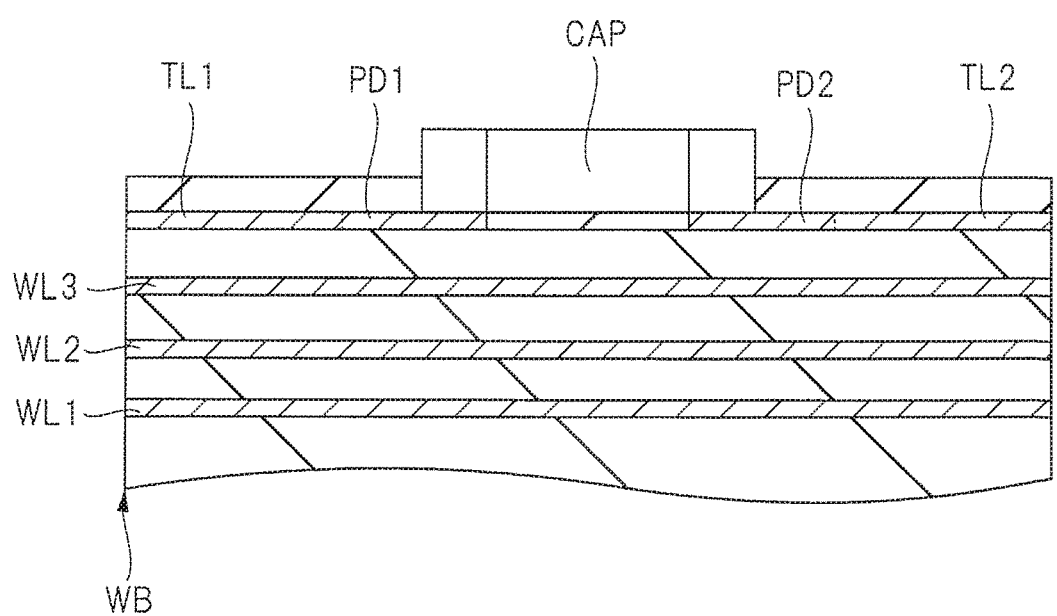
FIG. 4 is a cross-sectional view taken along line A-A of FIG. 3.

FIG. 4 is a cross-sectional view taken along line A-A of FIG. 3.

As shown in FIG. 4, a wiring WL1 is formed inside the wiring board WB, a wiring WL2 is formed on the wiring WL1, and a wiring WL3 is formed on the wiring WL2. The transmission line TL1 and the transmission line TL2 are formed in the same layer on the upper surface of the wiring board WB on the wiring WL3, and a DC cut-off capacitor CAP is connected to the transmission line TL1 and the transmission line TL2.

Next, the scope of improvement existing in the related art configured in this manner will be described.

For example, as shown in FIG. 3, when the DC cut-off capacitor CAP composed of a surface-mounted component is to be inserted between the transmission line TL1 and the transmission line TL2 formed on the wiring board WB, the capacitor pad PD1 and the capacitor pad PD2 for mounting the DC cut-off capacitor CAP are required. This is because the width (y direction) of the DC blocking capacitor CAP is usually greater than the width (y direction) of the transmission line TL1 or the width (y direction) of the transmission line TL2, and therefore the DC blocking capacitor CAP cannot be mounted on the transmission line TL1 or the transmission line TL2. Therefore, as shown in FIG. 3, usually, the capacitor pad PD1 having a width (y direction) greater than the width (y direction) of the transmission line TL1 is provided at the end of the transmission line TL1, and the capacitor pad PD2 having a width (y direction) greater than the width (y direction) of the transmission line TL2 is provided at the end of the transmission line TL2, and a DC blocking capacitor CAP is mounted over the capacitor pad PD1 and the capacitor pad PD2. In this manner, in the related art, the DC cut-off capacitor CAP can be inserted between the transmission line TL1 and the transmission line TL2, but since there is room for improvement due to the provision of the capacitor pad PD1 and the capacitor pad PD2, this room for improvement will be described below.

Figure 5:
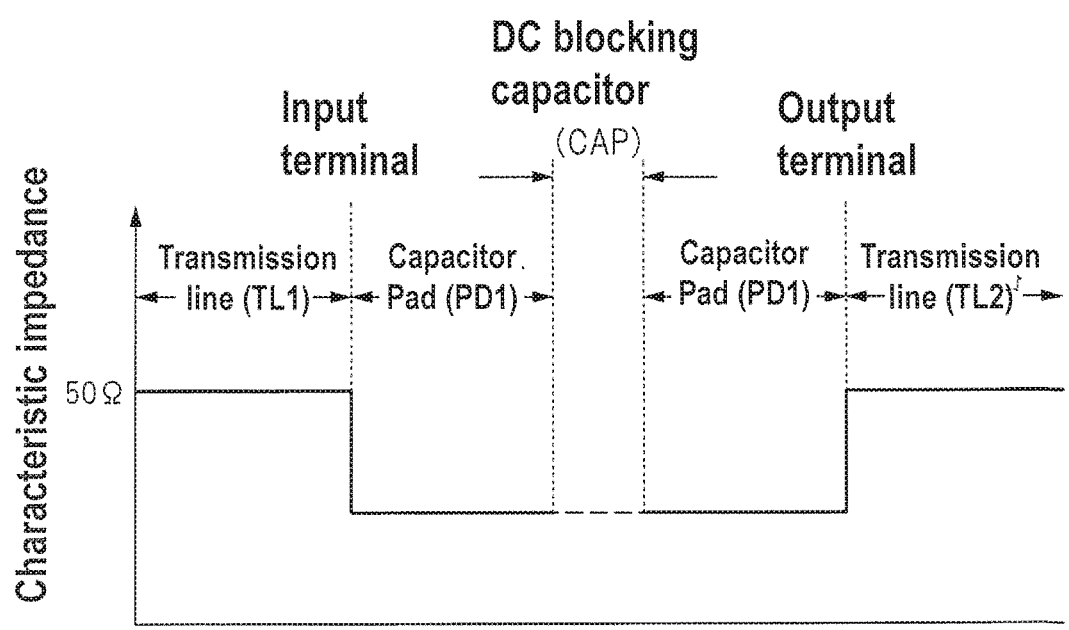
FIG. 5 is a diagram qualitatively showing characteristic impedances in a transmission line in which a DC cut-off capacitor is inserted in the related art.

FIG. 5 is a diagram qualitatively showing characteristic impedances in a transmission line in which a DC cut-off capacitor is inserted in the related art.

In FIG. 5, the characteristic impedance of the transmission line TL1 is set to 50Ω. However, as shown in FIG. 5, the characteristic impedances of the capacitor pads PD1 formed at the ends of the transmission line TL1 are smaller than 50Ω. This is because the width of the capacitor pad PD1 is greater than the width of the transmission line TL1, and therefore the parasitic capacitance per unit length of the capacitor pad PD1 is greater than the transmission line TL1. That is, in the capacitor pad PD1, the capacitance value of the denominator of the characteristic impedance defined by $\sqrt{(L/C)}$ becomes greater than the transmission line TL1, and as a result, the characteristic impedance of the capacitor pad PD1 becomes smaller than the characteristic impedance of the transmission line TL1. As a result, the characteristic impedances are mismatched at the inputs between the transmission lines TL1 and the capacitor pads PD1. This means that a part of the high-frequency signals that have transmitted through the transmission line TL1 is reflected at the inputs that are boundaries between the transmission line TL1 and the capacitor pads PD1.

Similarly, as shown in FIG. 5, the characteristic impedance of the transmission line TL2 is also set to 50Ω, but the characteristic impedance of the capacitor pads PD2 formed at the ends of the transmission line TL1 is smaller than 50Ω. This is because the width of the capacitor pad PD2 is greater than the width of the transmission line TL2, and the parasitic capacitance of the capacitor pad PD2 is greater than the parasitic capacitance of the transmission line TL2. As a result, the characteristic impedances are mismatched even at the outputs between the transmission lines TL2 and the capacitor pads PD2.

As described above, when the DC blocking capacitor CAP having a width greater than the width of the transmission line TL1 or the width of the transmission line TL2 is inserted between the transmission line TL1 and the transmission line TL2, the capacitor pad PD1 needs to be provided at the end of the transmission line TL1, and the capacitor pad PD2 needs to be provided at the end of the transmission line TL2. However, as a result that the width of the capacitor pad PD1 needs to be greater than the width of the transmission line TL1 and the width of the capacitor pad PD2 needs to be greater than the width of the transmission line TL2, a characteristic-impedance mismatch occurs at the input end, which is the boundary between the transmission line TL1 and the capacitor pad PD1, and at the output end, which is the boundary between the transmission line TL2 and the capacitor pad PD2. As a result, a part of the high-frequency signal is reflected at the input end and the output end, and as a result, transmission losses of the high-frequency signal transmitting from the transmission line TL1 to the transmission line TL2 becomes large. That is, in the related art, transmission losses of high-frequency signals transmitting from the transmission line TL1 to the transmission line TL2 are increased due to the provision of the capacitor pad PD1 and the capacitor pad PD2.

Figure 6:
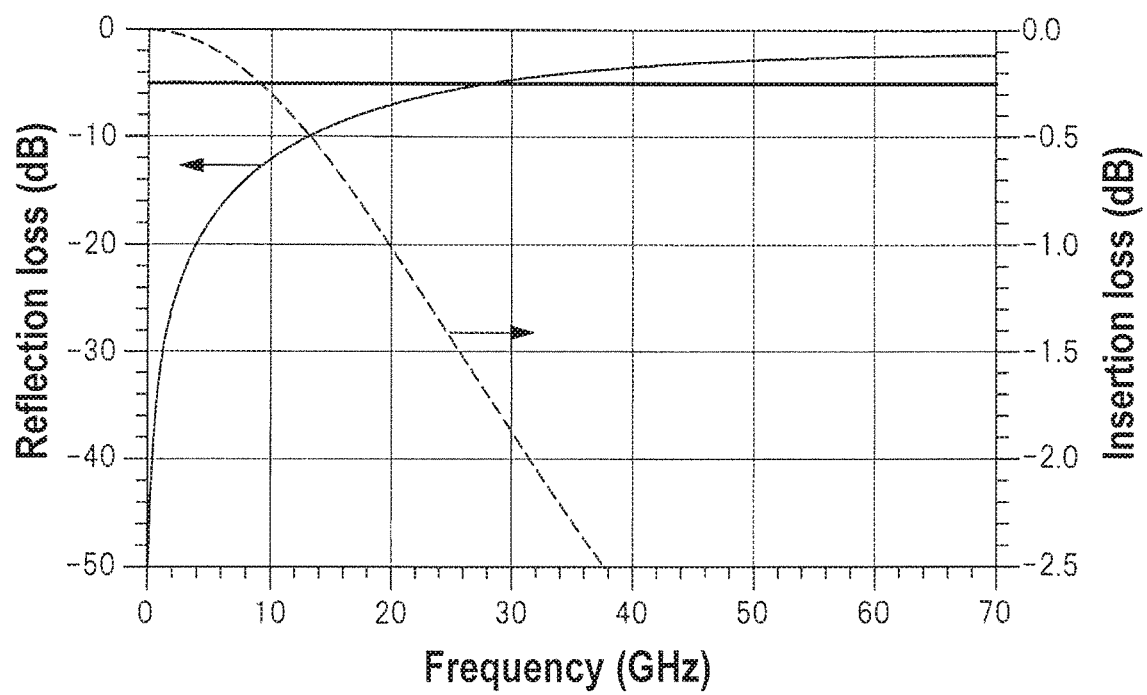
FIG. 6 is a graph showing the relationship between the frequency of a signal transmitting through a transmission line having a structure in which a DC cut-off capacitor is mounted and the reflection loss of the signal and the insertion loss of the signal in the related art.

FIG. 6 is a graph showing the relationship between the frequency of a signal transmitting through a transmission line having a DC cut-off capacitor mounting structure in the related art, see FIGS. 3 and 4, and the reflection loss of the signal and the insertion loss of the signal.

First, in FIG. 6, focusing on the relationship between the frequency of the signal and the reflection loss of the signal, it is understood that as the frequency of the signal increases, the reflection loss of the signal also increases. Next, in FIG. 6, focusing on the relationship between the frequency of the signal and the insertion loss of the signal, it can be seen that the insertion loss of the signal also increases as the frequency of the signal increases. In particular, from the graph showing the insertion loss in FIG. 6, it can be seen that the transmission band of 0.25 dB (97%) is only up to about 10 GHz. From the above, it can be seen that in the related art, the transmission loss of a signal in a frequency band exceeding 10 GHz becomes large.

As described above, in the related art, there is a room for improvement in that transmission losses of high-frequency signals transmitting from the transmission line TL1 to the transmission line TL2 is increased due to the provision of the capacitor pad PD1 and the capacitor pad PD2. In this respect, for example, it is conceivable to reduce the parasitic capacitance of the capacitor pad PD1. This is because if the parasitic capacitance of the capacitor pad PD1 can be reduced, the characteristic impedance of the capacitor pad PD1 defined by $\sqrt{(L/C)}$ can be increased, and as a result, the characteristic impedance of the capacitor pad PD1 can be made to coincide with the characteristic impedance of the transmission line TL1. If the characteristic impedance of the capacitor pad PD1 matches the characteristic impedance of the transmission line TL1, the mismatch of the characteristic impedance at the input end between the transmission line TL1 and the capacitor pad PD1 is resolved. This means that part of the high-frequency signals that have transmitted through the transmission line TL1 can be prevented from being reflected at the inputs that are boundaries between the transmission line TL1 and the capacitor pads PD1. Similarly, if the parasitic capacitance of the capacitor pad PD2 can be reduced, it is considered that the characteristic impedance of the capacitor pad PD2 can be matched with the characteristic impedance of the transmission line TL2. This eliminates the mismatch between the characteristic impedances at the outputs between the transmission lines TL2 and the capacitor pad s PD2. This means that it is possible to suppress reflections of high-frequency signals at the outputs, which are boundaries between the transmission lines TL2 and the capacitor pads PD2.

From the above, as a countermeasure against the room for improvement existing in the related art, it is considered that the characteristic impedance of the capacitor pad PD1 is matched with the characteristic impedance of the transmission line TL1 by reducing the parasitic capacitance of the capacitor pad PD1, and the characteristic impedance of the capacitor pad PD2 is matched with the characteristic impedance of the transmission line TL2 by reducing the parasitic capacitance of the capacitor pad PD2.

Here, since the measure for reducing the parasitic capacitance of the capacitor pad PD1 is the same as the measure for reducing the parasitic capacitance of the capacitor pad PD2, a measure for reducing the parasitic capacitance of the capacitor pad PD1 will be described below.

For example, in order to realize a measure to reduce the parasitic capacitance of the capacitor pad PD1, first, it is considered that the planar area of the capacitor pad PD1 is reduced. That is, it is conceivable to reduce the planar area of the capacitor pads PD1 as much as possible within the range in which the DC cut-off capacitor CAP can be mounted. However, since the capacitor pad PD1 is connected to the DC cut-off capacitor CAP, it is difficult to reduce the width of the capacitor pad PD1 so as to coincide with the width of the transmission line TL1 unless the size of the DC cut-off capacitor CAP is reduced. Here, since the DC blocking capacitor CAP having a small size is expensive, it is difficult to use the DC blocking capacitor CAP having a small size from the viewpoint of suppressing an increase in manufacturing costs of the semiconductor device, and therefore, it is not practical to reduce the planar area of the capacitor pads PD1 in order to reduce the parasitic capacitance.

Therefore, what is considered next is to increase the distances between the capacitor pads PD1 and a wiring formed in a lower layer. This is because a parasitic capacitance is generated between the capacitor pad PD1 and the wiring arranged in the lower layer of the capacitor pad PD1, and this parasitic capacitance is reduced as the distance between the capacitor pad PD1 and the wiring increases.

In this regard, for example, in FIG. 4 showing the related art, the capacitor pads PD1 overlap each of the wirings WL1~WL3 formed inside the wiring board WB in plan view. In particular, in FIG. 4 showing the related art, since the capacitor pad PD1 overlaps the wiring WL3 which is the closest in plan to the capacitor pad PD1, the parasitic capacitance due to the capacitor pad PD1 and the wiring WL3 increases.

Figure 7:
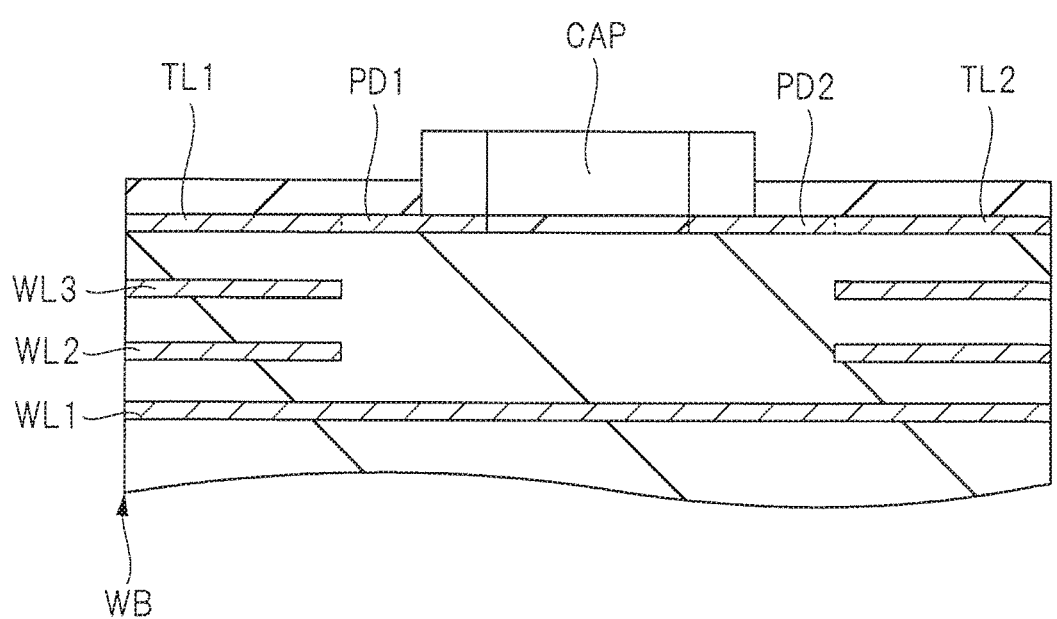
FIG. 7 is a diagram showing a countermeasure.

On the other hand, for example, FIG. 7 shows a countermeasure. In FIG. 7 showing this countermeasure, the capacitor pads PD1 overlap the wiring WL1 formed inside the wiring board WB in plan, but do not overlap each of wirings WL2~WL3 in plan. As a result, in FIG. 7 showing the countermeasure, since the capacitor pad PD1 does not overlap in plan with the wiring WL3 having the closest distance to the capacitor pad PD1 or the wiring WL2 having the next closest distance to the wiring WL3, the parasitic capacitance due to the capacitor pad PD1 and the wiring WL3 and the parasitic capacitance due to the capacitor pad PD1 and the wiring WL2 become negligibly small. As a result, in FIG. 7 showing the countermeasure, it is mainly necessary to consider only the parasitic capacitance with the interconnection WL1 farthest from the capacitor pad PD1. This means that the parasitic capacitance of the capacitor pad PD1 can be reduced in the countermeasure shown in FIG. 7. In this manner, in the above-described countermeasure, the parasitic capacitance of the capacitor pad PD1 can be reduced, and as a result, the characteristic impedance of the capacitor pad PD1 can be designed to match the characteristic impedance of the transmission line TL1.

Figure 8:
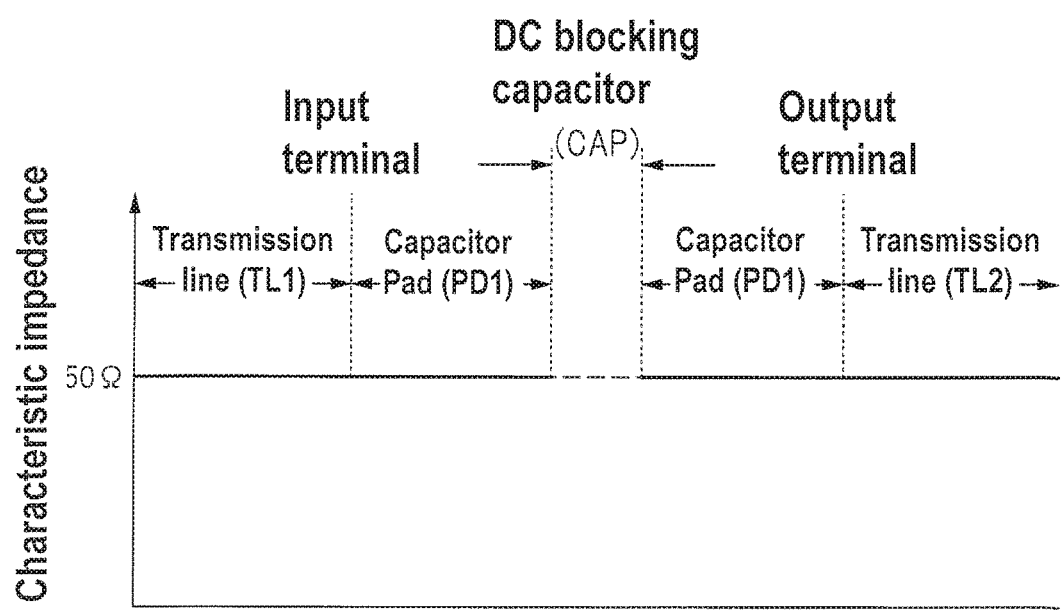
FIG. 8 is a diagram qualitatively showing characteristic impedances in a transmission line in which a DC cut-off capacitor is inserted in the countermeasure.

FIG. 8 is a diagram qualitatively showing characteristic impedances in a transmission line in which a DC cut-off capacitor is inserted in the countermeasure.

In FIG. 8, the characteristic impedance of the transmission line TL1 is set to 50Ω. In the countermeasure, as shown in FIG. 8, the characteristic impedances of the capacitor pads PD1 formed at the ends of the transmission line TL1 can also be set to 50Ω. That is, in the countermeasure, the characteristic impedance of the capacitor pad PD1 can be made to coincide with the characteristic impedance of the transmission line TL1 by using the wiring structures shown in FIG. 7. This eliminates the mismatch between the characteristic impedance at the input between the transmission line TL1 and the capacitor pad PD1. As a result, reflection of the signal at the input, which is boundary between the transmission line TL1 and the capacitor pad PD1, is suppressed.

Similarly, by using an interconnection configuration shown in FIG. 7, the characteristic impedance of the transmission line TL2 can be set to 50Ω, and the characteristic impedance of the capacitor pad PD2 formed at the end of the transmission line TL2 can also be set to 50Ω. That is, in the countermeasure, the characteristic impedance of the capacitor pad PD2 can be made to coincide with the characteristic impedance of the transmission line TL2. This makes it possible to eliminate the mismatch between the characteristic impedances at the output between the transmission line TL2 and the capacitor pad PD2. Therefore, reflection of signal at the output, which is boundary between the transmission line TL2 and the capacitor pad PD2, is suppressed.

From the above, it is considered that in the countermeasure, as a result of matching of the characteristic impedance at the input end and the output end, the transmission loss of the high-frequency signal transmitting from the transmission line TL1 to the transmission line TL2 can be reduced as compared with the related art.

Figure 9:
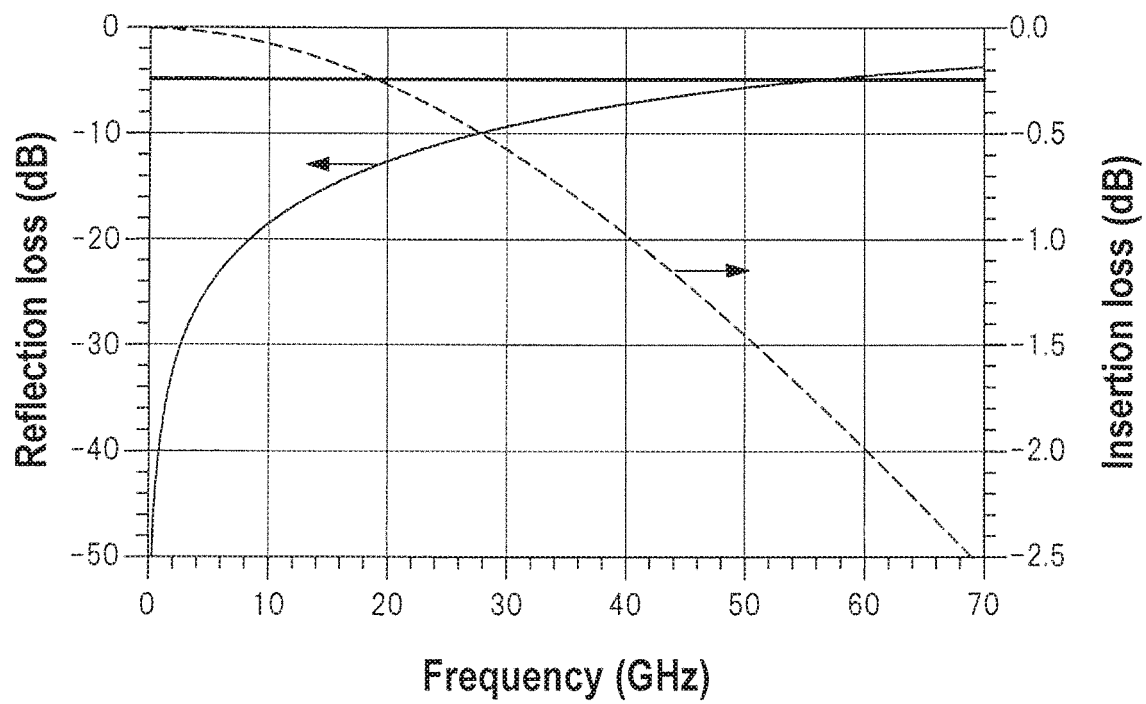
FIG. 9 is a graph showing the relationship between the frequency of a signal transmitting through a transmission line having a structure in which a DC cut-off capacitor is mounted and the reflection loss of the signal and the insertion loss of the signal in the countermeasure.

More specifically, FIG. 9 is a graph showing the relationship between the frequency of a signal transmitting through a transmission line having a DC cut-off capacitor mounting structure (see FIG. 7) and the reflection loss of the signal and the insertion loss of the signal.

In FIG. 9, focusing on the relationship between the frequency of the signal and the reflection loss of the signal, as the frequency of the signal increases, the reflection loss of the signal also increases. On the other hand, it can be seen that the reflection loss in the high-frequency band is reduced as compared with, for example, FIG. 6 showing the related art. Next, in FIG. 9, when attention is paid to the relationship between the frequency of the signal and the insertion loss of the signal, the insertion loss of the signal increases as the frequency of the signal increases, but from the graph showing the insertion loss in FIG. 9, it can be seen that the transmission band of 0.25 dB (97%) is about 20 GHz. That is, in FIG. 6 showing the related art, the transmission band of 0.25 dB (97%) is about 10 GHz, whereas in FIG. 9 showing the countermeasure, the transmission band of 0.25 dB (97%) is improved to about 20 GHz. From the above, it can be seen that in the countermeasure shown in FIG. 9, the transmission loss of the signal is much improved as compared with the related art shown in FIG. 6.

According to the above-mentioned countermeasure, the transmission loss of the signal transmitting through the transmission line in which the DC cut-off capacitor is inserted can be much reduced as compared with the related art. However, in the countermeasure, the DC cut-off capacitor CAP itself is not considered. That is, in the countermeasure, for example, as shown in FIG. 8, by considering the matching of the characteristic impedance between the transmission line TL1 and the capacitor pad PD1 and the matching of the characteristic impedance between the transmission line TL2 and the capacitor pad PD2, the transmission loss of the signal is attempted to be reduced. However, in the countermeasure, the presence of the DC blocking capacitor CAP provided between the capacitor pad PD1 and the capacitor pad PD2 is not considered. In the case of signal transmission having a transmission band of about 20 GHz, the influence of the DC cut-off capacitor CAP is hardly neglected, but in the case of signal transmission having a transmission band exceeding 20 GHz, for example, transmission loss caused by the DC cut-off capacitor CAP cannot be ignored. This is because the DC cut-off capacitor CAP includes not only a capacitance but also a parasitic inductance because it is composed of chip components. That is, the impedance caused by the parasitic inductance is "$j\omega L$", and the impedance "$j\omega L$" increases as the frequency ($\omega=2\pi f$) increases. That is, assuming that the parasitic inductance "L" existing in the DC cut-off capacitor CAP is constant, when the frequency of the signal is low, the impedance "$j\omega L$" is small and negligible, whereas when the frequency of the signal is high, the impedance "$j\omega L$" becomes large and therefore, the impedance cannot be ignored.

Figure 10:
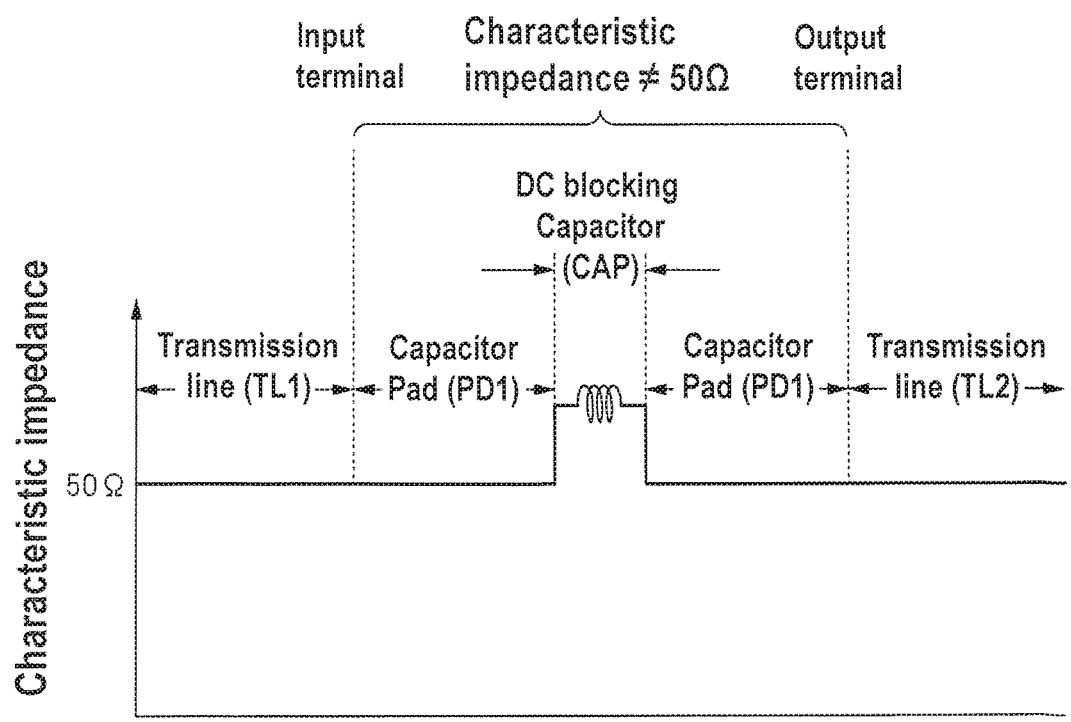
FIG. 10 is a diagram qualitatively showing the characteristic impedance in the transmission line in which the DC cut-off capacitor is inserted when the frequency of the signal becomes high in the countermeasure.

FIG. 10 is a diagram qualitatively showing the characteristic impedance in the transmission line in which the DC cut-off capacitor is inserted when the frequency of the signal becomes high in the countermeasure.

As shown in FIG. 10, when the frequency of the signal increases, the characteristic impedance based on the parasitic inductance existing in the DC cut-off capacitor CAP becomes apparent. That is, the characteristic impedance based on the parasitic inductance existing in the DC cut-off capacitor CAP is greater than 50Ω. Therefore, even if the characteristic impedance of the capacitor pad PD1 and the characteristic impedance of the capacitor pad PD2 are adjusted to 50Ω, the characteristic impedance seen from the input end (the characteristic impedance obtained by combining the capacitor pad PD1, the DC blocking capacitor CAP and the capacitor pad PD2) deviates from 50Ω to increase the reflection loss and the insertion loss.

As described above, a countermeasure against the room for improvement existing in the related art is effective in that transmission loss can be reduced much more than in the related art in signal transmission having a transmission band of about 20 GHz. However, in signal transmission having a transmission band exceeding 20 GHz, the transmission loss (the reflection loss and the insertion loss) becomes large. This is because the effect of the parasitic inductance included in the DC cut-off capacitor is not considered in the above-mentioned countermeasure. That is, when signal transmission having a transmission band exceeding 20 GHz is assumed, a countermeasure against the room for improvement existing in the related art is insufficient. That is, the above-mentioned countermeasure lacks the recognition that the parasitic inductance included in the DC cut-off capacitor has a large adverse effect on the transmission loss of the signal. In other words, in order to reduce the transmission loss in signal transmission having a transmission band exceeding 20 GHz, the above-described countermeasure requires some method of electrically canceling the parasitic inductance included in the DC cut-off capacitor CAP. Alternatively, in order to realize signal transmission having a transmission band exceeding 20 GHz, a new design method is required in place of the above-mentioned countermeasure.

Therefore, in the Embodiment 1, in order to realize signal transmission having a transmission band exceeding 20 GHz, the parasitic inductance of the DC cutoff capacitor CAP is not removed, but is used actively, thereby improving the signal transmission performance. Hereinafter, the technical idea in the Embodiment 1 to which this device is applied will be described.

The basic idea in the Embodiment 1 is not to remove the parasitic inductance inherent in the DC cut-off capacitor, but to improve the signal transmission performance by actively utilizing the parasitic inductance inherent in the DC cut-off capacitor as a component of the band-pass filter. Specifically, the basic idea in the Embodiment 1 is, for example, on the assumption that a band-pass filter including a capacitive component and an inductance component is provided in the transmission line, the idea that the capacitor pad is used as the capacitive component of the band-pass filter and the parasitic inductance of the DC blocking capacitor is used as the inductance component of the band-pass filter.

Hereinafter, the basic idea in the Embodiment 1 will be described in detail.

Figure 11:
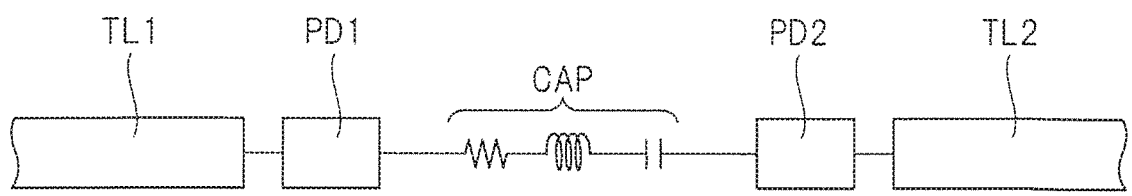
FIG. 11 is a diagram showing a transmission line in which a DC cut-off capacitor is inserted.

FIG. 11 is a diagram showing a transmission line in which a DC cut-off capacitor is inserted.

In FIG. 11, the capacitor pad PD1 is connected to an end portion of the transmission line TL1, and the capacitor pad PD2 is connected to an end portion of the transmission line TL2. A DC blocking capacitor CAP is connected between the capacitor pad PD1 and the capacitor pad PD2.

The DC cut-off capacitor CAP is formed of, for example, a chip component. As shown in FIG. 11, the DC cut-off capacitor CAP can be regarded as being composed of a parasitic resistance element, a parasitic inductor element, and a capacitive element connected in series with each other in terms of an equivalent circuit. At this time, the impedance based on the resistance value of the parasitic resistance element is "R", and does not have frequency dependence. On the other hand, the impedance based on the parasitic inductance element becomes "jωL" and increases as the frequency increases. The impedance based on the capacitive element becomes "1/jωC" and decreases as the frequency increases. Therefore, first, when a high-frequency signal is transmitted to the DC cut-off capacitor CAP, the impedance "1/jωC" based on the capacitance element decreases, so that the capacitive element can be regarded as a short-circuit with respect to the high-frequency signal. On the other hand, the impedance "jωL" based on the parasitic inductance element increases as the frequency of the high-frequency signal increases, while the impedance "R" based on the resistive element does not change (does not have frequency dependence) even if the frequency of the high-frequency signal increases. Therefore, the influence of the impedance "jωL" based on the parasitic inductance element becomes much greater than the influence of the impedance "R" based on the resistive element relative to the high-frequency signal. As described above, for example, as shown in FIG. 12, for a high-frequency signal, the DC cutoff capacitor CAP appears as a parasitic inductance element. As a result, the DC cut-off capacitor CAP functions as if it were a low-pass filter for a high-frequency signal. This is because the impedance "jωL" based on the parasitic inductance element increases as the frequency of the high-frequency signal increases, and as the impedance increases, the high-frequency signal becomes difficult to pass.

The basic idea in the Embodiment 1 is that a parasitic inductance which is inherent in the DC cut-off capacitor CAP described above and functions as a low-pass filter for a high-frequency signal is used as a component of a band-pass filter.

Figure 13:
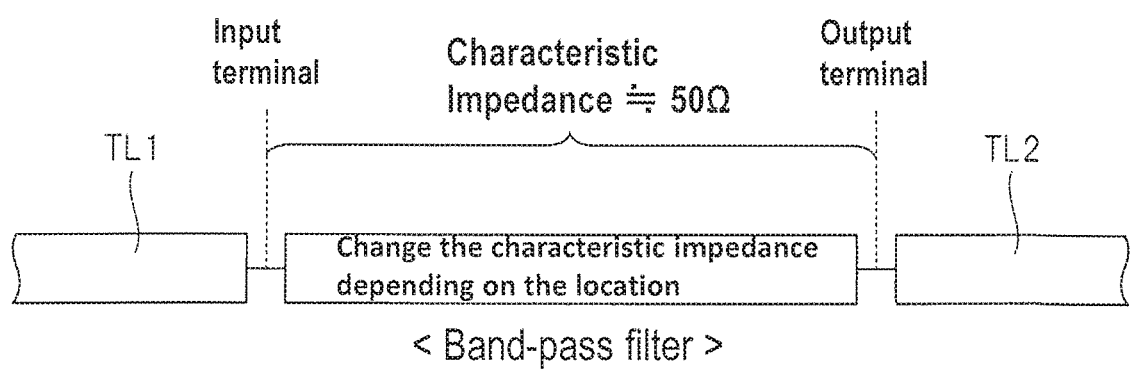
FIG. 13 is a diagram for explaining an example in which a band-pass filter is provided in a transmission line.

Hereinafter, how to configure the band-pass filter in the Embodiment 1 will be described. FIG. 13 is a diagram for explaining an example in which a band-pass filter is provided in a transmission line.

In FIG. 13, band-pass filters are formed between the transmission line TL1 and the transmission line TL2. Specifically, the boundary between the transmission line TL1 and the band-pass filter is set as the input end, and the boundary between the transmission line TL2 and the band-pass filter is set as the output end. At this time, the characteristic impedance of the band-pass filter seen from the input end is set to approximately 50Ω. As a result, the characteristic impedance of the transmission line TL1 substantially matches the characteristic impedance of the band-pass filters. Similarly, considering the symmetry, the characteristic impedance of the band-pass filter seen from the outputting end is also approximately 50Ω, and the characteristic impedance of the transmission line TL2 and the characteristic impedance of the band-pass filter are approximately the same. As a result, the high-frequency signals in the pass band of the band-pass filter transmit from the transmission line TL1 to the transmission line TL2 through the band-pass filter.

Here, specifically, the band-pass filter shown in FIG. 13 can be realized by a configuration in which the characteristic impedance is changed depending on the location in the transmission line between the input terminal and the output terminal.

Figure 14:
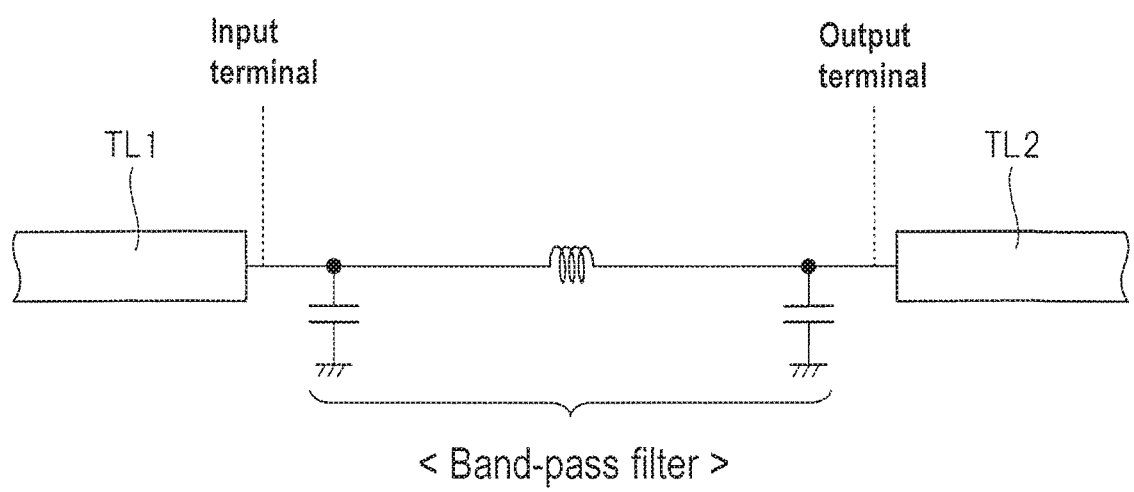
FIG. 14 is a diagram showing a configuration example of a band-pass filter provided between transmission lines.

For example, FIG. 14 is a diagram showing a configuration example of band-pass filters provided between the transmission line TL1 and the transmission line TL2.

In FIG. 14, the band-pass filter can be composed of an inductor element provided at the center and a pair of capacitive elements provided so as to sandwich the inductor element. At this time, in the band-pass filters shown in FIG. 14, the characteristic impedances of the pair of capacitive elements are designed to be smaller than the characteristic impedances of the transmission lines TL1 and TL2, and the characteristic impedances of the inductor elements are designed to be higher than the characteristic impedances of the transmission lines TL1 and TL2. As a result, a configuration in which the characteristic impedance is changed depending on the location is realized. In this manner, the band-pass filter according to the Embodiment 1 can be configured.

Figure 15:
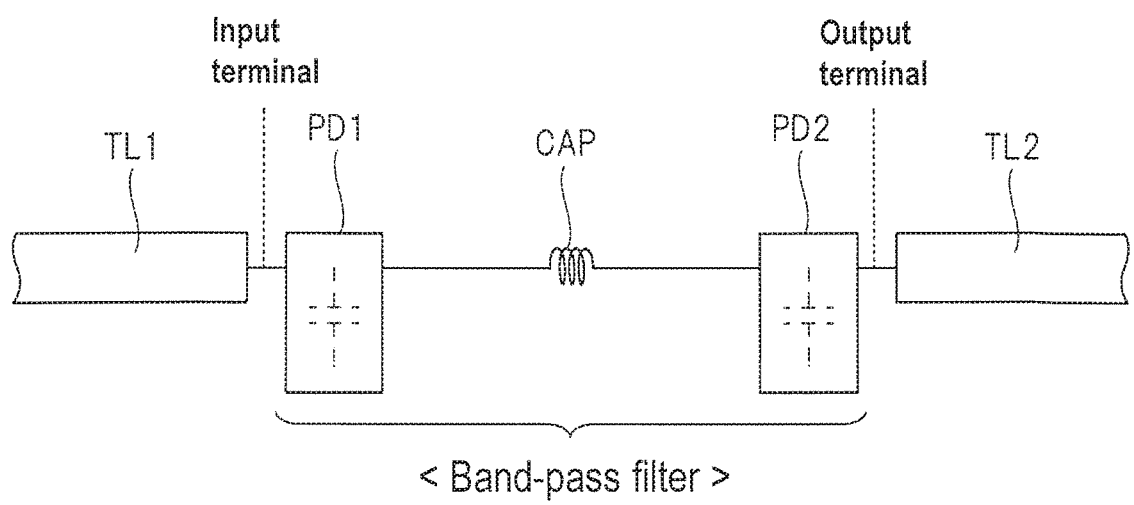
FIG. 15 is a diagram showing an example of constructing a band-pass filter by embodying the basic idea in Embodiment 1.

FIG. 15 is a diagram showing an example of constructing a band-pass filter by embodying the basic idea in the Embodiment 1.

In FIG. 15, the inductor element provided at the center is composed of a parasitic inductance inherent in the DC cut-off capacitor CAP. On the other hand, a pair of capacitance elements sandwiching the inductor element provided in the center portion is composed of a capacitor pad PD1 and a capacitor pad PD2. As a result, the basic idea in the Embodiment 1 that the parasitic inductance inherent in the DC cut-off capacitor CAP is actively used as a component of the band-pass filter is realized.

Figure 16:
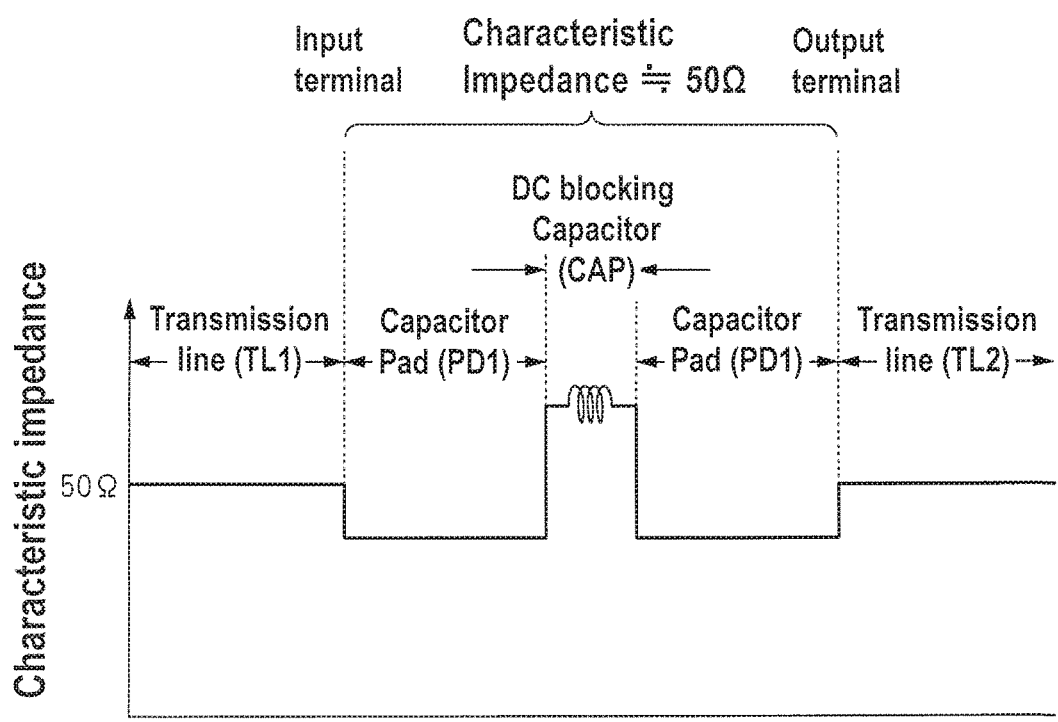
FIG. 16 is a diagram qualitatively showing characteristic impedances in a transmission line in which a DC cut-off capacitor is inserted in the Embodiment 1.

FIG. 16 is a diagram qualitatively showing the characteristic impedance in the transmission line in which the DC blocking capacitor is inserted in the Embodiment 1.

In FIG. 16, the characteristic impedance of the transmission line TL1 is set to 50Ω. The characteristic impedance of the capacitor pad PD1 is smaller than the characteristic impedance of the transmission line TL1. Similarly, the characteristic impedance of the transmission line TL2 is set to 50Ω, and the characteristic impedance of the capacitor pad PD2 is smaller than the characteristic impedance of the transmission line TL2. As described above, in the Embodiment 1, each of the characteristic impedance of the capacitor pad PD1 and the characteristic impedance of the capacitor pad PD2 is smaller than 50Ω. Subsequently, the characteristic impedance of the DC cutoff capacitor CAP sandwiched between the capacitor pad PD1 and the capacitor pad PD2 is greater than the characteristic impedance of 50Q. As a result, a configuration in which the characteristic impedance is changed depending on the location between the input terminal and the output terminal is realized, and a band-pass filter is realized.

In particular, as shown in FIG. 16, on the assumption that the characteristic impedance is changed depending on the location, by adjusting the characteristic impedance of the band-pass filter (capacitor pad PD1+DC cut-off capacitor CAP+capacitor pad PD2) as viewed from the input end to approximately 50Ω, the high-frequency signal of the frequency in the pass band of the band-pass filter is transmitted from the transmission line TL1 to the transmission line TL2 through the band-pass filter. At this time, in FIG. 16, since there is a place where the characteristic impedances are mismatched in the band-pass filter, i.e., a boundary between the input end and the output end, the DC blocking capacitor CAP and the capacitor pad PD1, and a boundary between the DC blocking capacitor CAP and the capacitor pad PD2, multiple reflections occur inside the band-pass filter. However, in the Embodiment 1, the capacitance value of the capacitor pad PD1 and the capacitance value of the capacitor pad PD2 are adjusted in view of the parasitic inductances inherent in the DC cut-off capacitor CAP so that nodes of the standing wave generated by superimposing a plurality of reflected waves exist at the input end and the output end. Therefore, the generation of the reflected wave is suppressed at the input end and the output end. Therefore, according to the Embodiment 1, it is possible to transmit a high-frequency signal (traveling wave) having a frequency in the pass band of the band-pass filter while suppressing generation of a reflected wave at the input end and the output end. Therefore, according to the Embodiment 1, the transmission loss in signal transmission can be reduced.

Figure 12:
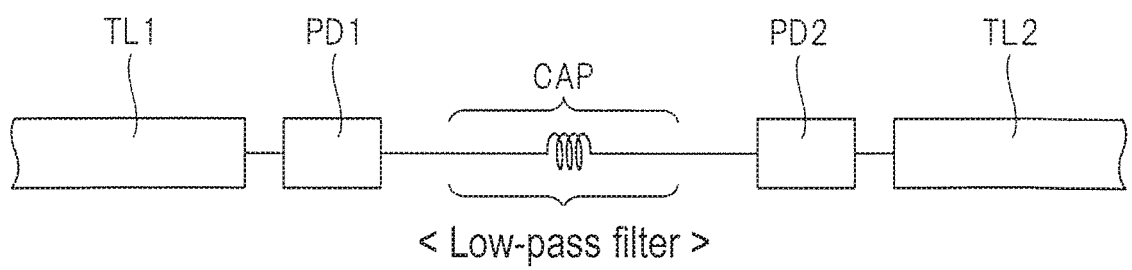
FIG. 12 is a diagram showing a transmission line when the frequency of a signal becomes high.
Figure 17:
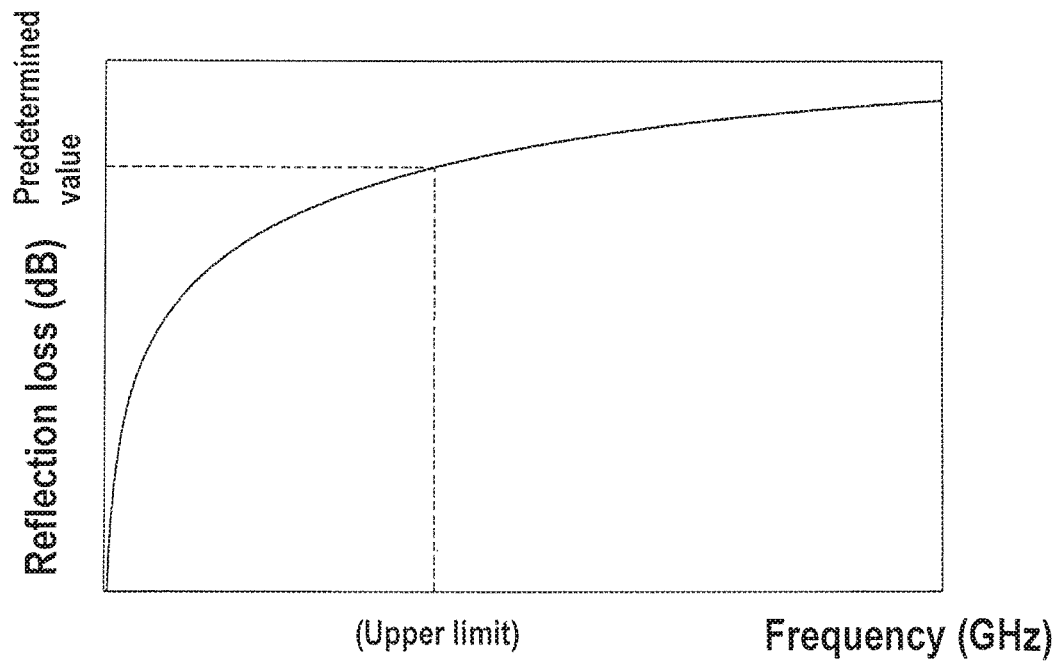
FIG. 17 is a graph qualitatively showing the relationship between the frequency of the signal transmitting through the transmission line shown in FIG. 12 and the reflection loss.

For example, FIG. 17 is a graph qualitatively showing the relationship between the frequency of a signal transmitting through the transmission line shown in FIG. 12 and the reflection loss.

As shown in FIG. 17, in the transmission line of FIG. 12, the parasitic inductance of the DC cut-off capacitor CAP functions as if it were a low-pass filter, and as the frequency of the signal increases, the reflection loss monotonously increases. As a result, the upper limit of the frequency at which the reflection loss becomes smaller than the predetermined value becomes low.

Figure 18:
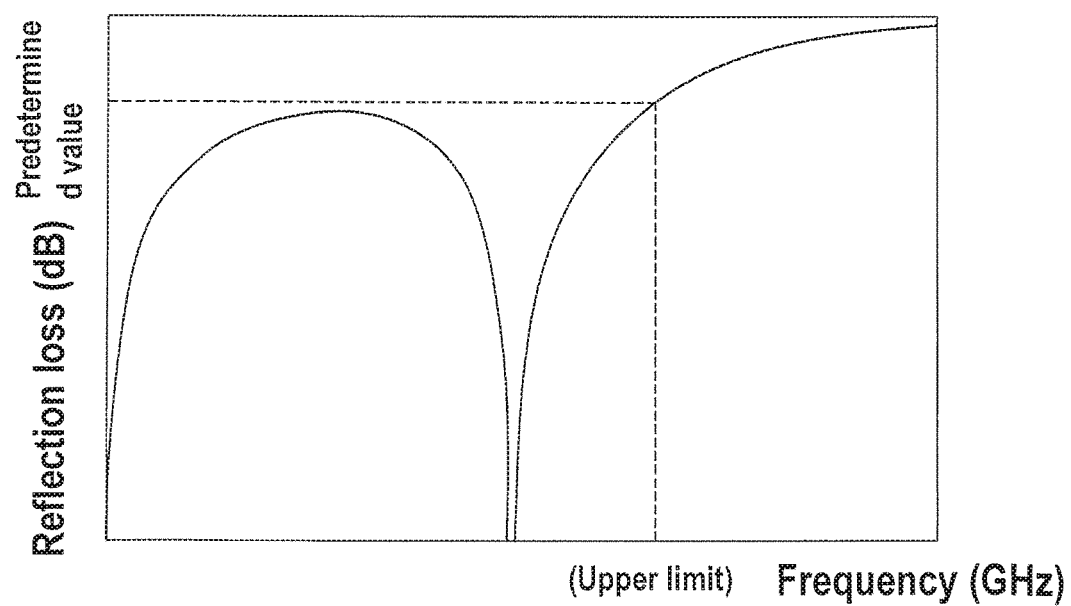
FIG. 18 is a graph qualitatively showing the relationship between the frequency of the signal transmitting through the transmission line shown in FIG. 15 and the reflection loss.

On the other hand, FIG. 18 is a graph qualitatively showing the relationship between the frequency of the signal transmitting through the transmission line shown in FIG. 15 and the reflection loss.

As shown in FIG. 18, in the transmission line of FIG. 15, the parasitic inductance of the DC cutoff capacitor CAP, the capacitance of the capacitor pad PD1, and the capacitance of the capacitor pad PD2 constitute a band-pass filter instead of a low-pass filter. As a result, as shown in FIG. 18, it can be seen that the reflection loss is remarkably reduced at the frequency within the pass band of the band-pass filter. As a result, as shown in FIG. 18, the reflection loss is also reduced in the frequency band near this frequency. Therefore, in the Embodiment 1 shown in FIG. 18, the upper limit of the frequency at which the reflection loss becomes smaller than the predetermined value becomes greater than the upper limit of the frequency shown in FIG. 17. Therefore, by adopting the basic idea in the Embodiment 1, transmission loss (reflection loss and insertion loss) in signal transmission having a transmission band exceeding 20 GHz can be reduced, for example. In this manner, according to the basic idea of Embodiment 1 in which the parasitic inductance existing in the DC blocking capacitor CAP is not removed, but the parasitic inductance existing in the DC blocking capacitor CAP is actively used as a component of the band-pass filter, the signal transmission performance can be improved.

The basic idea in the Embodiment 1 is novel in that it is not an idea of providing some method of electrically canceling the parasitic inductance included in the DC cut-off capacitor CAP in order to reduce the transmission loss in signal transmission, but an idea of providing a design method of actively utilizing the parasitic inductance existing in the DC cut-off capacitor CAP as a constituent element of the band-pass filter.

Next, a capacitor pad structure embodying the basic idea of the Embodiment 1 described above will be described with reference to the drawings.

Figure 19:
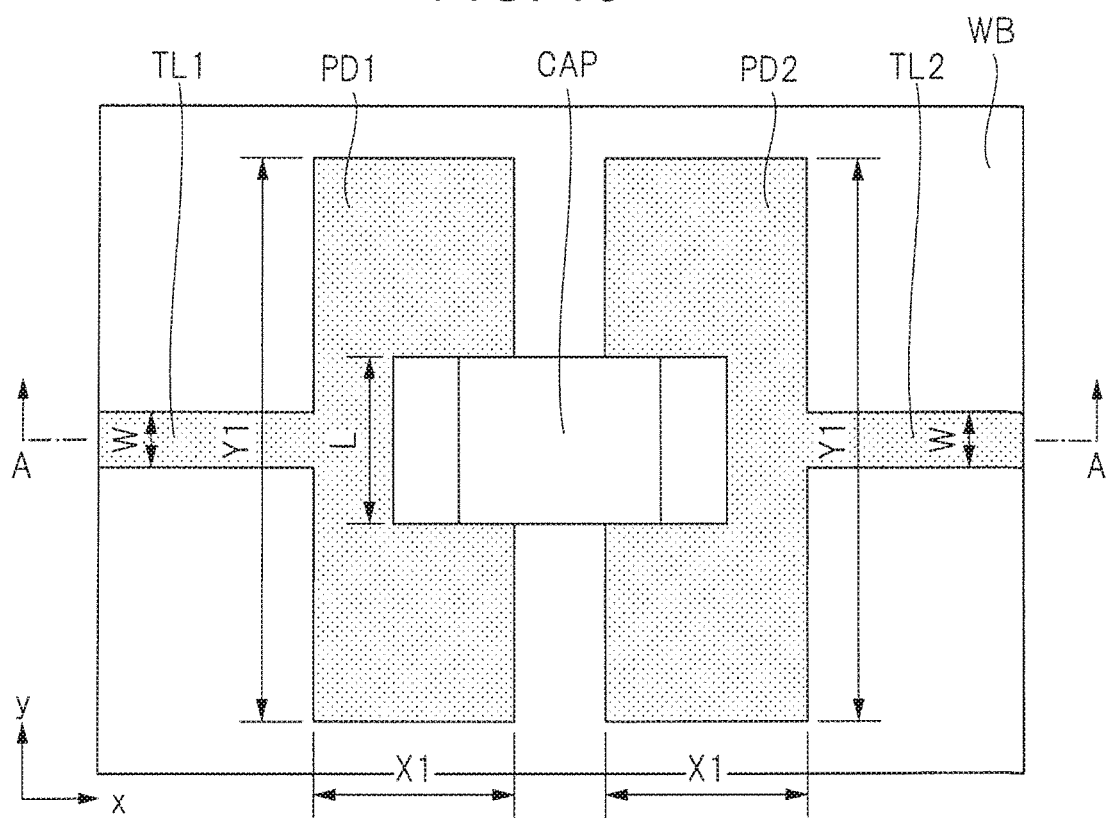
FIG. 19 is a plan view showing a capacitor pad structure provided in a transmission line in which a DC cut-off capacitor is inserted.

FIG. 19 is a plan view showing a capacitor pad structure provided in a transmission line in which a DC cut-off capacitor is inserted.

In FIG. 19, a transmission line TL1 through which high-frequency signal transmits, the capacitor pad PD1 electrically connected to the transmission line TL1, the capacitor pad PD2 arranged to face the capacitor pad PD1 away from the capacitor pad, and the transmission line TL2 electrically connected to the capacitor pad PD2 are formed on the surface of the wiring board WB. The DC blocking capacitor CAP including a parasitic inductance is mounted over the capacitor pad PD1 and the capacitor pad PD2 so as to be connected to both the capacitor pad PD1 and the capacitor pad PD2.

Each of the transmission lines TL1 and TL2 extends in the x-direction, and capacitor pads PD1 are provided at ends of the transmission lines TL1. Similarly, capacitor pad PD2 is provided at the end of the transmission line TL2. The capacitor pad PD1 and the capacitor pad PD2 are arranged side by side in the x-direction with predetermined distances therebetween.

Figure 20:
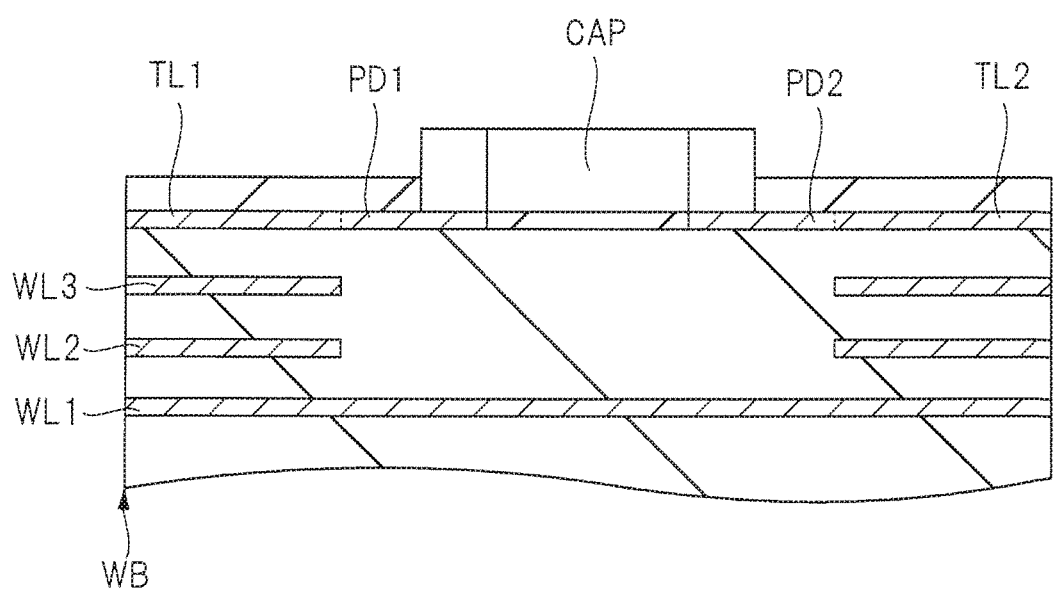
FIG. 20 is a cross-sectional view taken along line A-A of FIG. 19.

FIG. 20 is a cross-sectional view taken along line A-A of FIG. 19. As shown in FIG. 20, for example, the wiring WL1 is formed in the wiring board WB in the Embodiment 1, the wiring WL2 is formed in the upper layer of the wiring WL1, and the wiring WL3 is formed in the upper layer of the wiring WL2. A transmission line TL1 and a transmission line TL2 are formed in the same layer on the upper surface of the wiring board WB on the wiring WL3. The capacitor pad PD1 is integrally formed with the transmission line TL1, and the capacitor pad PD2 is integrally formed with the transmission line TL2. Further, the DC cut-off capacitance CAP is mounted so as to be connected to both the capacitor pad PD1 and the capacitor pad PD. At this time, in FIG. 20, the capacitor pads PD1(PD2) are overlapped with the wiring WL1 formed inside the wiring board WB in plan view, and are not overlapped with the wirings WL2~WL3 in plan view. On the other hand, as shown in FIG. 20, the transmission line TL1(TL2) overlaps the wirings WL1~WL3 formed inside the wiring board WB in plan view.

The capacitor pad PD1, the DC cut-off capacitor CAP, and the capacitor pad PD2 configured as described above are constituent elements of a band-pass filter inserted between the transmission line TL1 and the transmission line TL2.

Next, the dimensional relationship will be described.

As illustrated in FIG. 19, the plane shape of the capacitor pad PD1 is rectangularly shaped. When the width of the capacitor pad PD1 in the x-direction is set to "X1," and the width of the capacitor pad PD1 in the y-direction is set to "Y1," the relationship "X1<Y1" is established. In the Embodiment 1, the planar shape of the capacitor pad PD1 and the planar shape of the capacitor pad PD2 are the same. Therefore, the correlation "X1<Y1" is also established in the capacitor pads PD2. When the width of the DC blocking capacitor CAP in the y direction is "L", the width "Y1" of the capacitor pads PD1 in the y direction is greater than the width "L" of the DC blocking capacitor CAP in the y direction. For example, the width "Y1" of the capacitor pads PD1 in the y direction is twice or more and four times or less the width "L" of the DC blocking capacitor CAP in the y direction. Similarly, the width "Y1" of the capacitor pads PD2 in the y direction is greater than the width "L" of the DC cut-off capacitor CAP in the y direction. For example, the width "Y1" of the capacitor pads PD2 in the y direction is twice or more and four times or less the width "L" of the DC blocking capacitor CAP in the y direction.

Next, as shown in FIG. 19, the width of the transmission line TL1 in the y direction is equal to the width of the transmission line TL2 in the y direction, and when the width of the transmission line TL1 in the y direction is "W", the width "Y1" of the capacitor pad PD1 in the y direction is greater than the width "W" of the transmission line TL1 in the y direction, and the width "Y1" of the capacitor pad PD2 in the y direction is also greater than the width "W" of the transmission line TL2 in the y direction.

Next, the relationship between the characteristic impedances will be described.

In FIG. 19, the characteristic impedance of the transmission line TL1 and the characteristic impedance of the transmission line TL2 are set to be equal to each other, for example, 50Ω. The characteristic impedance of the capacitor pad PD1 is smaller than the characteristic impedance of the transmission line TL1, and the characteristic impedance of the capacitor pad PD2 is smaller than the characteristic impedance of the transmission line TL2. For example, the characteristic impedance of the capacitor pad PD1 is smaller than 50Ω, and the characteristic impedance of the capacitor pad PD2 is also smaller than 50Ω.

Further, in FIG. 19, the characteristic impedance of the system in which the capacitor pad PD1, the DC cutoff capacitor CAP, and the capacitor pad PD2 are combined is closer to the characteristic impedance of the transmission line TL1 than the characteristic impedance of the capacitor pad PD1 or the characteristic impedance of the capacitor pad PD2. For example, the characteristic impedances of the bandpass filters in which the capacitor pad PD1, the DC blocking capacitor CAP, and the capacitor pad PD2 are combined are approximately 50Ω. Therefore, the characteristic impedance of the transmission line TL1 and the characteristic impedance of the band-pass filter are matched, and the characteristic impedance of the transmission line TL2 and the characteristic impedance of the band-pass filter are also matched.

Next, the characteristic points of the capacitor pad structure in the Embodiment 1 will be described.

The characteristic point of the capacitor pad structure in the Embodiment 1 is that the planar area of the capacitor pad is adjusted to an optimum range in order to use the capacitor pad as a capacitive component of the band-pass filter. In other words, in order to make the capacitor pad effectively function as a component of the band-pass filter, it is needless to say that the characteristic impedance of the capacitor pad is reduced to be smaller than the characteristic impedance of the transmission line (50Ω), but it is further desirable to set the characteristic impedance of the capacitor pad to be in an appropriate range. This is because even if the characteristic impedance of the capacitor pad is smaller than the characteristic impedance of the transmission line (50Ω), the capacitor pad cannot be effectively used as a component of the band-pass filter unless the characteristic impedance of the capacitor pad falls within an appropriate range. Considering that the characteristic impedance of the capacitor pad depends on the parasitic capacitance of the capacitor pad, setting the characteristic impedance of the capacitor pad in an appropriate range means setting the parasitic capacitance of the capacitor pad in an appropriate range. Further, in the Embodiment 1, since it is considered to set the parasitic capacitance of the capacitor pad in an appropriate range by changing the planar area of the capacitor pad, setting the parasitic capacitance of the capacitor pad in an appropriate range means setting the planar area of the capacitor pad in an appropriate range. That is, according to the study by the present inventor, it is necessary to increase the planar area of the capacitor pad in order to make the characteristic impedance of the capacitor pad smaller than the characteristic impedance of the transmission line, and on the other hand, if the planar area of the capacitor pad is excessively large, the signal transmission performance deteriorates on the contrary. That is, when the parasitic capacitance of the capacitor pad is used as the capacitive component of the band-pass filter, an appropriate range exists in the planar area of the capacitor pad.

Therefore, in the following description, when the parasitic capacitance of the capacitor pad is used as the capacitive component of the band-pass filter, an appropriate range of the planar area of the capacitor pad will be described.

Figure 21:
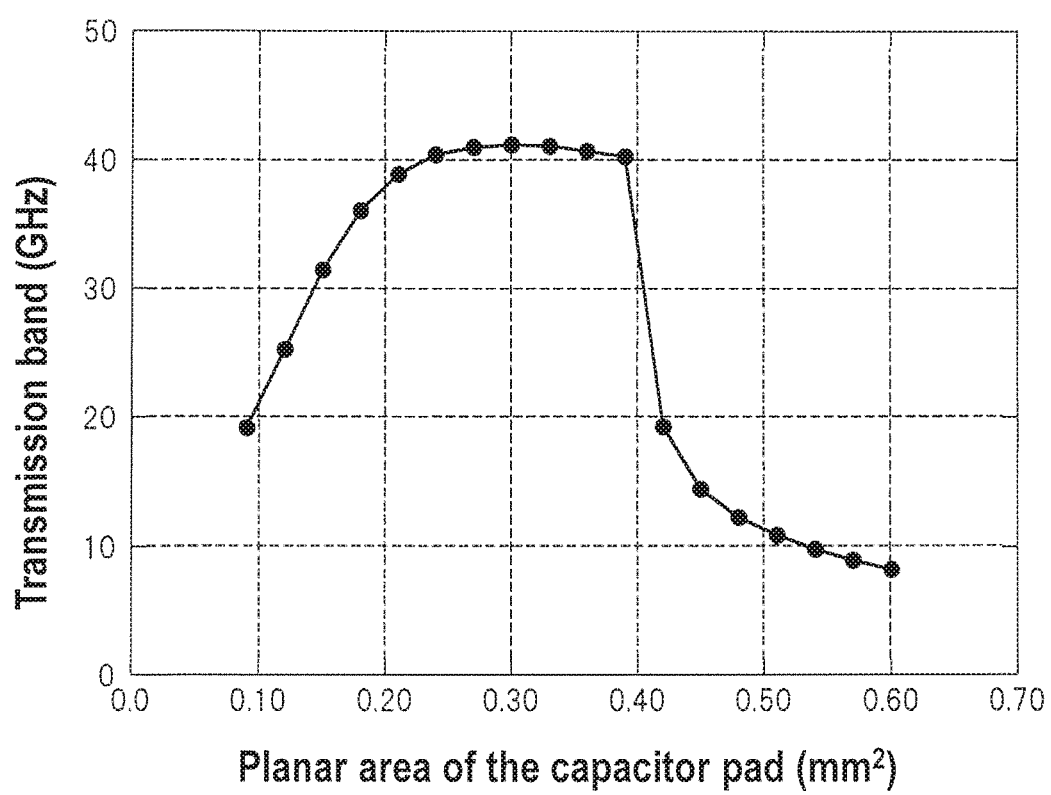
FIG. 21 is a graph showing the relationship between the planar area of the capacitor pad and the transmission band of the signal.

FIG. 21 is a graph showing the relationship between the planar area of the capacitor pad and the transmission band of the signal.

Here, the transmission band of the signal means a transmission band of 0.25 dB (97%).

In FIG. 21, the horizontal axis represents the planar area ($mm^2$) of the capacitor pads, and the vertical axis represents the transmission band (GHz) of the signals. As shown in FIG. 21, when the planar area of the capacitor pad is "0.1 $mm^2$", the transmission band of the signal is "20 GHz". Then, as the planar area of the capacitor pad increases from "0.1 $mm^2$", the transmission band of the signal increases. Further, when the planar area of the capacitor pad becomes equal to or greater than "0.2 $mm^2$" and equal to or less than "0.4 $mm^2$", the transmission band of the signal becomes about "40 GHz". Thereafter, when the planar area of the capacitor pad exceeds "0.4 $mm^2$", the transmission band of the signal is lowered, and for example, when the planar area of the capacitor pad becomes about "0.6 $mm^2$", the transmission band of the signal is lowered to "10 GHz".

As a result, for example, in order to obtain a transmission band exceeding 20 GHz, it is necessary to make the planar area of the capacitor pad greater than "0.1 $mm^2$" and less than or equal to "0.4 $mm^2$". In particular, in order to obtain a transmission band of 40 GHz, which is twice the transmission band of 20 GHz, it is necessary to set the planar area of the capacitor pad to be equal to or greater than 0.2 $mm^2$ and equal to or less than 0.4 $mm^2$.

Here, the case where the planar area of the capacitor pad is "0.1 $mm^2$" corresponds to the case where the width "Y1"

of the capacitor pad PD1 (PD2) in the y direction is substantially equal to the width "L" of the DC blocking capacitor CAP in the y direction in FIG. 19. Therefore, making the planar area of the capacitor pad PD1 (PD2 greater than "0.1 mm$^2$" and less than or equal to "0.4 mm$^2$" while fixing the width "X1" of the capacitor pad PD1 (PD2) in the x direction corresponds to making the width "Y1" of the capacitor pad PD1(PD2) in the y direction greater than the width "L" of the DC blocking capacitor CAP in the y direction and four times of L (4L) or less. In this case, a transmission band exceeding 20 GHz can be obtained.

Similarly, in FIG. 19, when the average area of the capacitor pad PD1 (PD2 is 0.2 mm$^2$ or more and 0.4 mm$^2$ or less with the width "X1" in the x-direction of the capacitor pad PD1(PD2 fixed, the width "Y1" in the y-direction of the capacitor pad PD1 (PD2 corresponds to two times or more and four times of L or less of the width "L" in the y-direction of the DC cut-off capacitor CAP. In this case, a transmission band of 40 GHz, which is twice the transmission band of 20 GHz, can be obtained.

From the above, the characteristic point in the Embodiment 1 is that the planar area of the capacitor pad is set to an appropriate area so that the capacitor pad becomes a component of the band-pass filter, but specifically, the characteristic point in the Embodiment 1 is that, for example, in FIG. 19, the width "Y1" in the y direction of the capacitor pad PD1 (PD2) is set to be not less than twice and not more than four times the width "L" in the y direction of the DC blocking capacitor CAP. Thus, according to the Embodiment 1, since the capacitor pad PD1 (PD2) is used as the capacitive component s of the bandpass filters, the plane area (plane size) of the capacitor pad PD1 (PD2) can be adjusted to an optimum range, and as a result, a transmission band of 40 GHz which greatly exceeds 20 GHz can be obtained.

In particular, in the Embodiment 1, for example, in FIG. 19, since the planar area of the capacitor pad PD1(PD2) is changed while the width "X1" in the x-direction of the capacitor pad PD1 (PD2) is fixed, the transmission band of 40 GHz can be obtained in a wide range of the planar area of the capacitor pad PD1(PD2 from 0.2 mm$^2$ to 0.4 mm$^2$.

In other words, since the planar area of the capacitor pad PD1 (PD2) is changed while the width "X1" of the capacitor pad PD1 (PD2) in the x direction is fixed, a transmission band of 40 GHz can be obtained in a wide range in which the width "Y1" of the capacitor pad PD1 (PD2) in the y direction is set to be twice or more and four times or less the width "L" of the DC cutoff capacitor CAP in the y direction.

That is, in FIG. 19, changing the planar area of the capacitor pad PD1 (PD2) while fixing the width "X1" of the capacitor pad PD1 (PD2) in the x-direction means changing the planar area of the capacitor pad PD1 (PD2) while keeping the distance between the input end, which is the boundary between the transmission line TL1 and the capacitor pad PD1, and the output end, which is the boundary between the transmission line TL2 and the capacitor pad PD2, constant. At this time, a standing wave is formed between the input end and the output end by superimposing the reflected wave, and nodes of the standing wave are formed at the input end and the output end, respectively. The fact that the distance between the input end and the output end is constant means that the position of the node of the standing wave is substantially fixed to the input end and the output end. This means that even if the planar area of the capacitor pad PD1 (PD2) is changed, the nodes of the standing wave are easily localized at the input end and the output end, thereby suppressing the generation of the reflected wave at the input end and the output end. Therefore, as in the Embodiment 1, when the planar area of the capacitor pad PD1 (PD2) is changed in a state in which the width "X1" of the capacitor pad PD1 (PD2) in the x-direction is fixed, that is, in a state in which the distance between the input end and the output end is fixed, even if the planar area of the capacitor pad PD1 (PD2) is changed, the generation of reflected waves at the input end and the output end can be suppressed continuously. As a result, a transmission band of 40 GHz can be obtained in a wide range in which the width "Y1" of the capacitor pad PD1 (PD2) in the y direction is set to be twice or more and four times or less of the width "L" of the DC cutoff capacitor CAP in the y direction.

Therefore, the minutiae according to the Embodiment 1 can be said to be, for example, in FIG. 19, with the width "X1" in the x-direction of the capacitor pad PD1 (PD2) fixed, the width "Y1" in the y-direction of the capacitor pad PD1 (PD2) can be said to be two times or more and four times or less than the width "L" of the DC cut-off capacitor CAP in the y-direction.

In the Embodiment 1, a technical idea of improving the transmission band of signal by a ladder-type bandpass filter including the parasitic inductances of the DC blocking capacitor CAP and the parasitic capacitances of a pair of capacitor pads PD1 (PD2) formed so as to sandwich the DC blocking capacitor CAP has been described. That is, in the Embodiment 1, the band-pass filter having one stage of ladders is configured by the DC cut-off capacitor CAP and the pair of capacitor pads PD1 (PD2).

Here, the ladder type bandpass filter can be easily broadened by increasing the number of ladder stages. Therefore, in the Modification 1, a technical idea for realizing a wide transmission band by configuring a band-pass filter having two ladder stages will be described.

Figure 22:
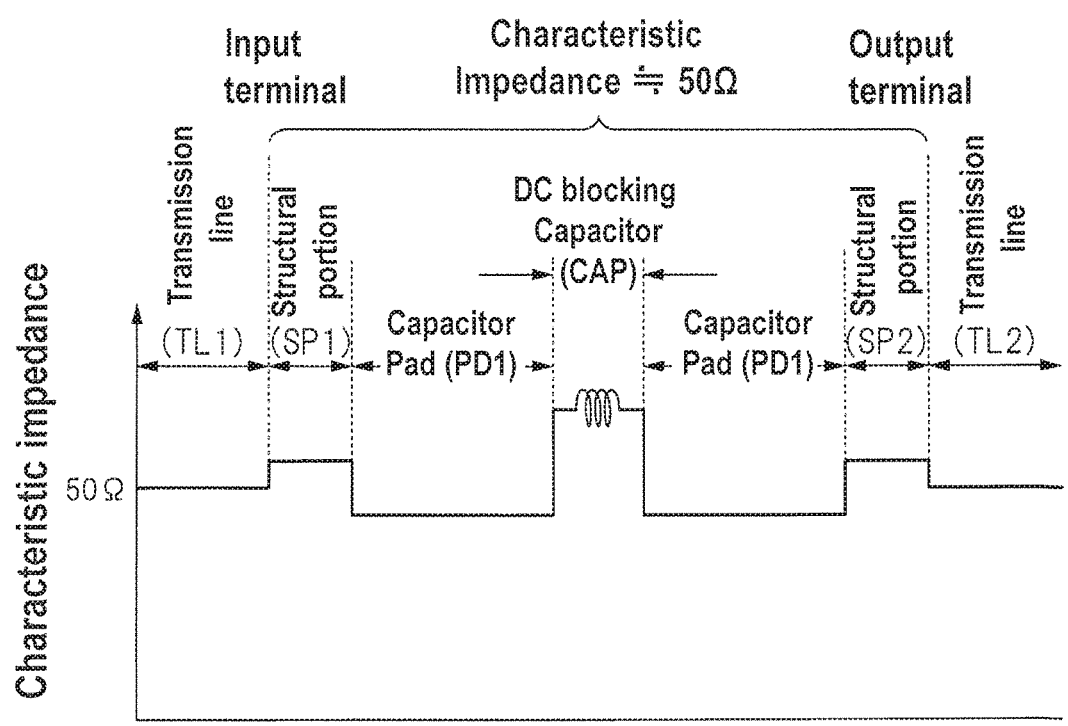
FIG. 22 is a diagram qualitatively showing the characteristic impedance in the transmission line in which the DC blocking capacitor is inserted in the Modification 1 of the Embodiment 1.

FIG. 22 is a diagram qualitatively showing the characteristic impedance in the transmission line in which the DC blocking capacitor is inserted in the Modification 1. In FIG. 22, the characteristic impedance of the transmission line TL1 is set to 50Ω. The structural part SP1 is provided so as to be connected to the transmission line TL1, and the characteristic impedance of the structural part SP1 is greater than the characteristic impedance of the transmission line TL1. Further, the capacitor pad PD1 is provided so as to be connected to the structural part SP1, and the characteristic impedance of the capacitor pad PD1 is smaller than the characteristic impedance of the transmission line TL1.

Similarly, the characteristic impedance of the transmission line TL2 is set to 50Ω. The structural part SP2 is provided so as to be connected to the transmission line TL2, and the characteristic impedance of the structural part SP2 is greater than the characteristic impedance of the transmission line TL2. Further, the capacitor pad PD2 is provided so as to be connected to the structural part SP2, and the characteristic impedance of the capacitor pad PD2 is smaller than the characteristic impedance of the transmission line TL2. As described above, in the Modification 1, each of the characteristic impedance of the structural part SP1 and the characteristic impedance of the structural part SP2 is greater than 50Ω, and each of the characteristic impedance of the capacitor pad PD1 and the characteristic impedance of the capacitor pad PD2 is smaller than 50Ω.

Subsequently, the characteristic impedance of the DC cutoff capacitor CAP sandwiched between the capacitor pad PD1 and the capacitor pad PD2 is greater than the characteristic impedance of 50Ω.

As a result, a configuration in which the characteristic impedance is changed depending on the site between the input terminal and the output terminal is realized, and a band-pass filter in which the number of ladder stages is two is realized. In other words, the DC cut-off capacitance CAP, the capacitor pads PD1 (PD2), and the structural part SP1 (SP2) realize two-stage band-pass filters.

In particular, also in the Modification 1, as shown in FIG. 22, the characteristic impedance of the band-pass filter (structure part SP1+capacitor pad PD1+DC blocking capacitor CAP+capacitor pad PD2+structural part SP2) viewed from the input end is adjusted to approximately 50Ω on the premise that the characteristic impedance is changed depending on the location. As a result, also in the Modification 1, the high-frequency signal having the frequency in the pass band of the band-pass filter is transmitted from the transmission line TL1 to the transmission line TL2 through the band-pass filter. At this time, in the band-pass filter, since there are places where the characteristic impedances are mismatched (boundaries between the input/output ends, the DC blocking capacitor CAP and the capacitor pad PD1, between the DC blocking capacitor CAP and the capacitor pad PD2, between the capacitor pad PD1 and the structure part SP1, and between the capacitor pad PD2 and the structure part SP2), multiple reflections occur inside the band-pass filter.

However, in the Modification 1, the capacitance value of the capacitor pad PD1 and the capacitance value of the capacitor pad PD2 are adjusted in view of the parasitic inductance inherent in the DC cut-off capacitor CAP, and the inductance value of the structural part SP1 and the inductance value of the structural part SP2 are adjusted so that the nodes of the standing wave generated by the superposition of a plurality of reflected waves exist at the input end and the output end. Therefore, the generation of the reflected wave is suppressed at the input end and the output end. Therefore, according to the Modification 1, it is possible to transmit a high-frequency signal (traveling wave) having a frequency in the pass band of the band-pass filter while suppressing generation of a reflected wave at the input end and the output end. Therefore, according to the Modification 1, transmission loss in signal transmission can be reduced.

Figure 23:
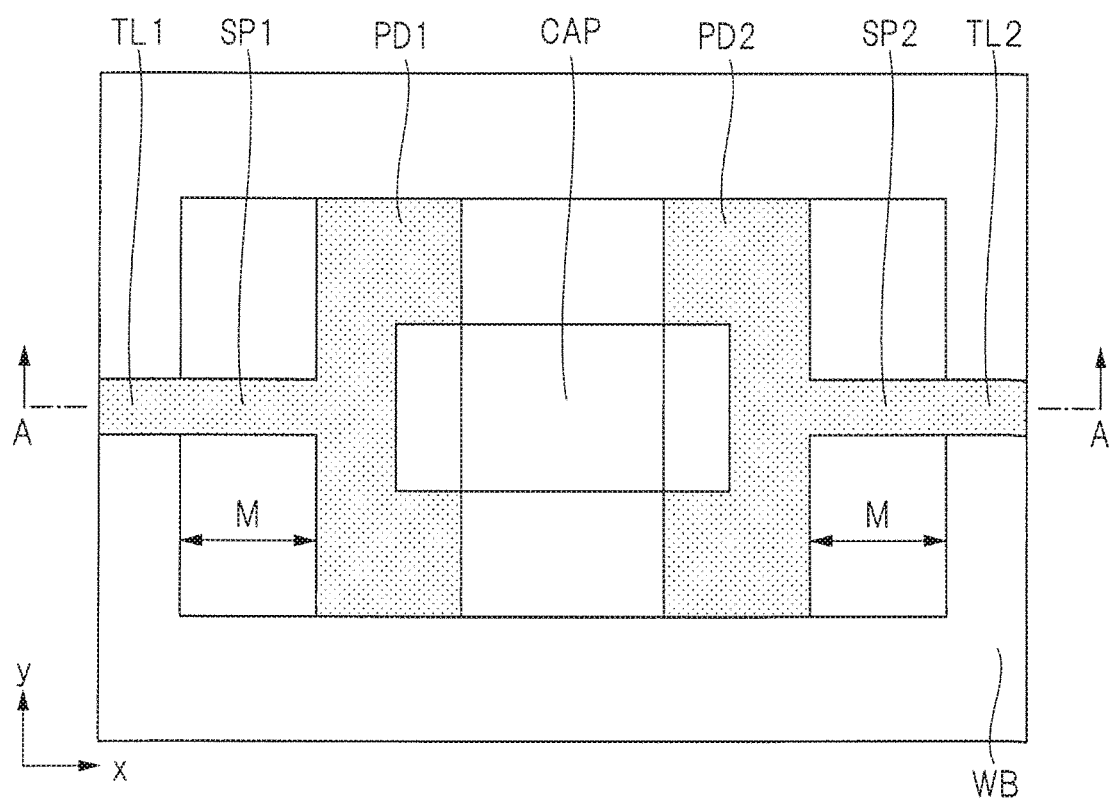
FIG. 23 is a plan view showing a capacitor pad structure provided in a transmission line in which a DC blocking capacitor is inserted in Modification 1 of Embodiment 1.

FIG. 23 is a plan view showing a capacitor pad structure provided in a transmission line in which a DC blocking capacitor is inserted in the Modification 1.

In FIG. 23, a transmission line TL1, a structural part SP1 connected to the transmission line TL1, a capacitor pad PD1 connected to the structural part SP1, a capacitor pad PD2 arranged to face the capacitor pad PD1 away from the capacitor pad, a structural part SP2 connected to the capacitor pad PD2, and a transmission line TL2 connected to the structural part SP2 are formed on the surface of the wiring board WB. A DC blocking capacitor CAP including a parasitic inductance is mounted over the capacitor pad PD1 and the capacitor pad PD2 so as to be connected to both the capacitor pad PD1 and the capacitor pad PD2.

Each of the transmission line TL1 and the transmission line TL2 extends in the x-direction, and the structural part SP1 is provided at an end portion of the transmission line TL1. Similarly, the structural part SP2 is provided at the end of the transmission line TL2. The planar shape of the structural part SP1 (SP2) is, for example, a rectangular shape. In the Modification 1, the width of the structural part SP1 (SP2) in the y direction is designed to be equal to the width of the transmission line TL1 (TL2) in the y direction in view of ease of manufacturing.

Figure 24:
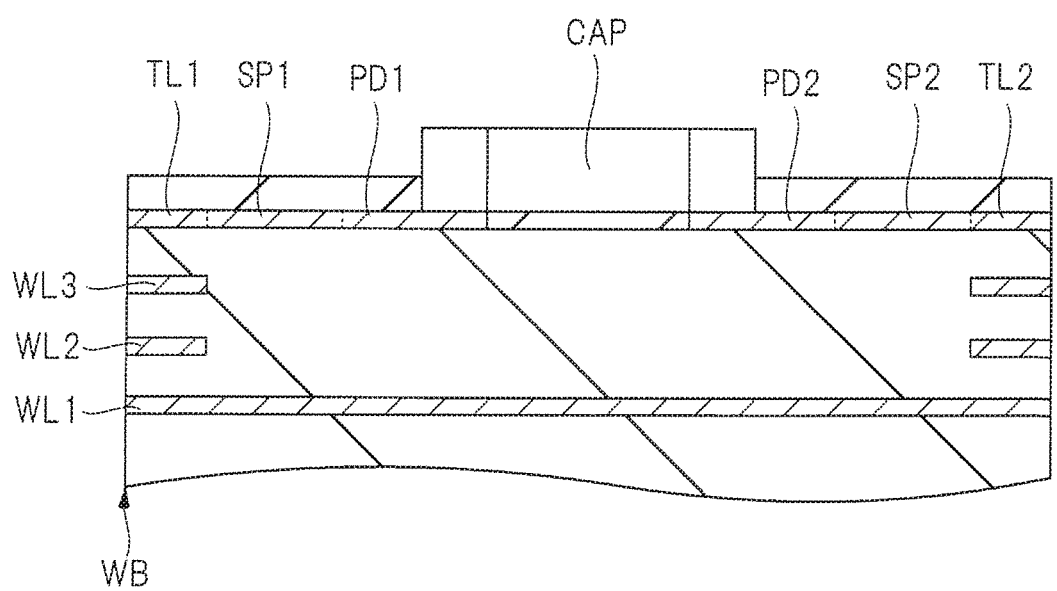
FIG. 24 is a cross-sectional view taken along line A-A of FIG. 23.

FIG. 24 is a cross-sectional view taken along line A-A of FIG. 23.

As shown in FIG. 24, for example, a wiring WL1 is formed in the wiring board WB in the Modification 1, a wiring WL2 is formed in the upper layer of the wiring WL1, and a wiring WL3 is formed in the upper layer of the wiring WL2. A transmission line TL1 and a transmission line TL2 are formed in the same layer on the upper surface of the wiring board WB on the wiring WL3. The structural part SP1 and the capacitor pad PD1 are formed integrally with the transmission line TL1, and the structural part SP2 and the capacitor pad PD2 are formed integrally with the transmission line TL2. Further, a DC cut-off capacitance CAP is mounted so as to be connected to both the capacitor pad PD1 and the capacitor pad PD.

At this time, also in FIG. 24, the capacitor pads PD1 (PD2) overlap the wiring WL1 formed inside the wiring board WB in plan view, but do not overlap the wirings WL2~WL3 in plan view. Similarly, in FIG. 24, the structural part SP1 (SP2) overlaps with the wiring WL1 formed inside the wiring board WB in plan view, and does not overlap with each wirings WL2~WL3 in plan view.

On the other hand, as shown in FIG. 24, the transmission line TL1 (TL2) overlaps the wirings WL1~WL3 formed inside the wiring board WB in plan view.

Further, also in the Modification 1, the width of the capacitor pads PD1 (PD2) in the y direction is not less than twice and not more than four times the width of the DC blocking capacitor CAP in the y direction.

The structural part SP1, the capacitor pad PD1, the DC blocking capacitor CAP, the capacitor pad PD2, and the structural part SP2 configured as described above constitute a band-pass filter having two stages of ladders inserted between the transmission line TL1 and the transmission line TL2.

The transmission band of the signals transmitted through the band-pass filters in the Modification 1 greatly depends on the length of the structural part SP1 (SP2) in the x-direction. Therefore, the relation between the length of the structural part SP1 (SP2) in the x-direction and the transmission band of signals will be described below.

Figure 25:
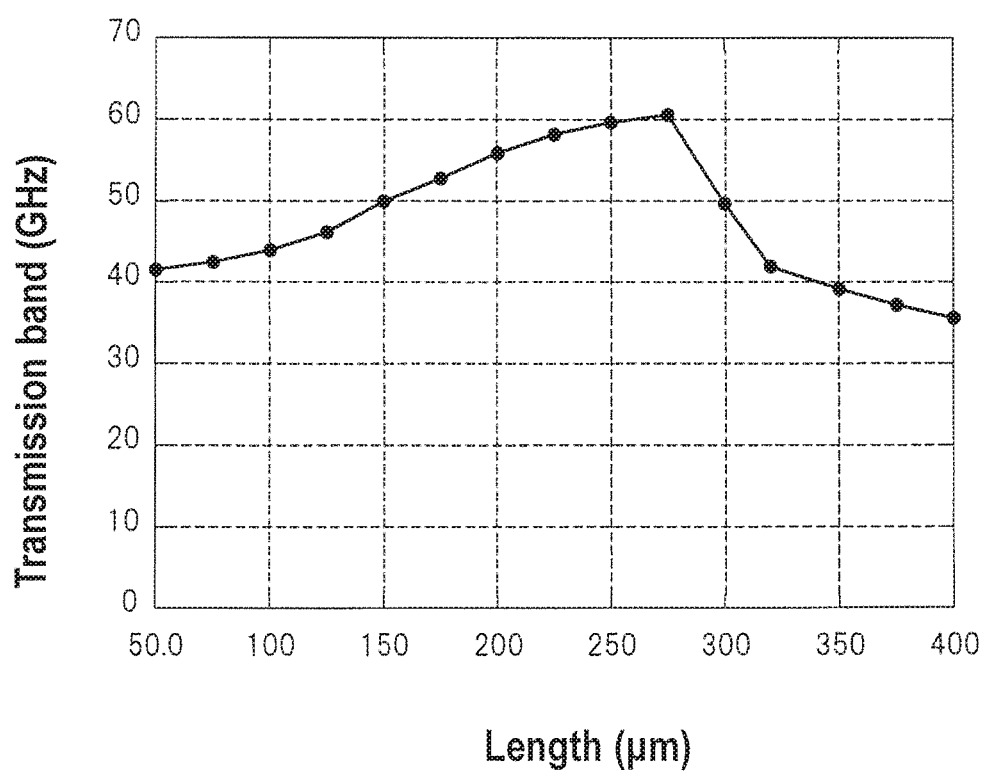
FIG. 25 is a graph showing a transmission band when the length of the structural portion shown in FIG. 23 in the x direction is changed.

FIG. 25 is a diagram showing a transmission band when the length "M" in the x-direction of the structural part SP1 (SP2) shown in FIG. 23 is changed.

In FIG. 25, the horizontal axis represents the length (μm) in the x-direction of the structural part SP1 (SP2), and the vertical axis represents the transmission band (GHz) of signals transmitted through the band-pass filters.

As shown in FIG. 25, when the length "M" of the structural portion SP1 (SP2) in the x-direction is increased from "50 μm" to "265 μm", the transmission band of signals increases from "40 GHz" to "60 GHz". On the other hand, if the length "M" of the structural part SP1 (SP2) in the x direction is further increased from "265 μm", the transmission band of the signal is gradually decreased from "60 GHz", and if the length "M" of the structural part SP1 (SP2) in the x direction exceeds "350 μm", the transmission band of the signal is lower than "40 GHz". Therefore, from the viewpoint of widening the transmission band of signals, it is desirable to set the length "M" of the structural part SP1 (SP2) in the x-direction to about 265 μm. As described above, according to the Modification 1, by adjusting the length "M" of the structural part SP1 (SP2) in the x-direction, it is possible to widen the transmission band of signals.

As described above, in order to widen the transmission band of signals, it is important to appropriately adjust the length "M" of the structural part SP1 (SP2) in the x-direction. That is, as shown in FIG. 25, even if the length "M" in the x-direction of the structural part SP1 (SP2) is too short or too long, the transmission band of signals cannot be widened.

Figure 26:
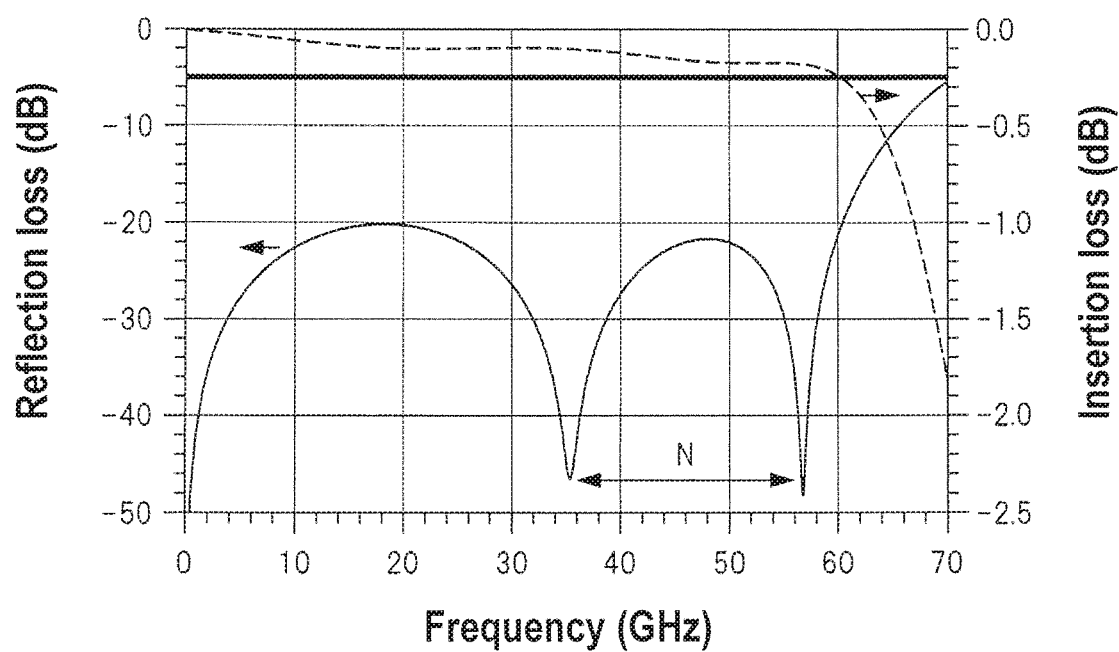
FIG. 26 is a graph showing the relationship between the frequency of the signal and the reflection loss and the frequency of the signal and the insertion loss when the length of the structural portion in the x direction is set to "265 µm".

This point will be described below. FIG. 26 is a graph showing the relation between the frequency of the signal and the reflected loss and the frequency of the signal and the inserted loss when the length "M" in the x-direction of the structural part SP1 (SP2) is set to "265 µm".

In FIG. 26, focusing on the frequency of the signal and the reflection loss, it is understood that the reflection loss is remarkably reduced at the frequency of "35 GHz" and the frequency of "57 GHz". In other words, in the band-pass filter having two ladder stages in the Modification 1, two poles are formed in which the reflection loss is remarkably reduced except for the DC point (frequency: 0). As a result, as shown in FIG. 26, the reflection loss is reduced to 60 GHz. That is, in the band-pass filter having one ladder stage as in the Embodiment 1, for example, as shown in FIG. 18, only one pole whose reflection loss is remarkably reduced is formed except for the DC point (frequency is 0). On the other hand, as in the Modification 1, in the band-pass filter having two ladder stages, two poles are formed in which reflection loss is remarkably reduced except for the DC point (frequency: 0). As a result, for example, as can be seen from a comparison between FIG. 18 and FIG. 26, the reflection loss can be reduced over a wide frequency band in the band-pass filter having a large number of poles in which the reflection loss is significantly reduced except for the DC point (frequency: 0). As a result, in FIG. 26, focusing on the frequency of the signal and the insertion loss, a transmission band of 0.25 dB (97%) can be secured up to a frequency of 60 GHz.

As described above, since the number of poles at which the reflection loss is remarkably reduced is increased by one in the band-pass filter having two stages of the ladder as compared with the band-pass filter having one stage of the ladder, the reflection loss can be reduced over a wide frequency band, and as a result, the transmission band of the signal can be widened.

Here, in FIG. 26, the distance "N" between the two poles at which the reflection loss is significantly reduced is important. This is because if the distance "N" between the two poles is too large, a region in which the reflection loss between the two poles cannot be sufficiently reduced occurs, and as a result, the transmission band of the signal cannot be widened. On the other hand, even if the distance "N" between the two poles is too small, there is no large difference between the case having one pole and the case having one pole, and the transmission band of the signal does not increase. Thus, there is a suitable range for the distance "N" between the two poles. The distance "N" between the two poles is determined, for example, by the length "M" in the x-direction of the structural part SP1 (SP2) shown in FIG. 23. For example, as the length "M" of the structural part SP1 (SP2) in the x-direction increases, the distance "N" between the two poles also increases. On the other hand, the smaller the length "M" of the structural part SP1 (SP2) in the x-direction, the smaller the distance "N" between the two poles.

This explains qualitatively the relation between the length "M" in the x-direction of the structural part SP1 (SP2) shown in FIG. 25 and the transmission band. That is, in FIG. 25, when the length "M" in the x-direction of the structural part SP1 (SP2) is small, the distance "N" between the two poles shown in FIG. 26 is small, and the transmission band of signals is not widened. Then, as shown in FIG. 25, as the length "M" of the structural part SP1 (SP2) in the x-direction gradually increases, the distance "N" between the two poles shown in FIG. 26 becomes an appropriate range, and the transmission band of the signals becomes wider. However, further, if the length "M" of the structural part SP1 (SP2) in the x-direction is increased, the distance "N" between the two poles becomes too large, and as a result, an area in which the reflective losses between the two poles cannot be sufficiently reduced is generated, so that the transmission band of the signals cannot be widened. In this manner, the relation between the length "M" in the x-direction of the structural part SP1 (SP2) shown in FIG. 25 and the transmission band can be qualitatively described. The length "M" in the x-direction of the structural portion SP1 (SP2) corresponding to the optimum spacing "N" between the two poles shown in FIG. 26 is "265 µm" (see FIG. 25).

Next, Modification 2 in Embodiment 1 will be described.

In the Embodiment 1, in order to make the characteristic impedance of the capacitor pad smaller than the characteristic impedance of the transmission line (50Ω), the planar area of the capacitor pad is intentionally increased. That is, in the Embodiment 1, for example, as shown in FIG. 19, the parasitic capacitance of the capacitor pad is increased by increasing the planar area of the capacitor pad, and the characteristic impedance of the capacitor pad is made smaller than the characteristic impedance of the transmission line.

In this regard, in the Modification 2, a different approach from that of the Embodiment 1 is used in order to make the characteristic impedance of the capacitor pad smaller than the characteristic impedance of the transmission line (50Ω). For example, the wiring WL2 and the wiring WL3 formed inside the wiring board WB are arranged so as not to overlap with the capacitor pad PD1 (PD2) in plan view as in the capacitor pad configuration in the Embodiment 1 shown in FIG. 20. On the other hand, in the Modification 2, the wiring WL2 and the wiring WL3 formed inside the wiring board WB are not arranged so as not to overlap with the capacitor pad PD1 (PD2) in plan view, but are arranged so as to overlap with the capacitor pad PD1 (PD2) in plan view. That is, in the Modification 2, in order to make the characteristic impedance of the capacitor pad smaller than the characteristic impedance of the transmission line, the configuration is realized in which the characteristic impedance of the capacitor pad is made smaller than the characteristic impedance of the transmission line (50Ω) by not increasing the planar area of the capacitor pad but increasing the parasitic capacitance between the capacitor pad and the wiring formed inside the wiring board.

Figure 27:
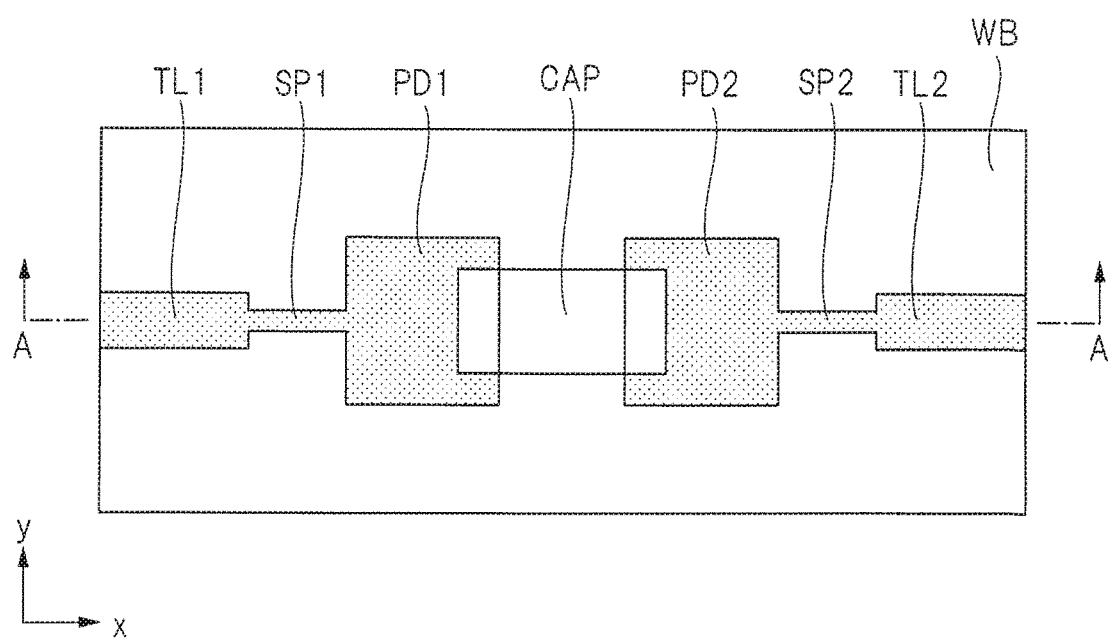
FIG. 27 is a plan view showing a capacitor pad structure provided in a transmission line in which a DC cut-off capacitor is inserted in Modification 2 of Embodiment 1.

Hereinafter, a concrete description will be given. FIG. 27 is a plan view showing a capacitor pad structure provided in a transmission line in which a DC blocking capacitor is inserted in the Modification 2.

In FIG. 27, a transmission line TL1, a structural part SP1 connected to the transmission line TL1, a capacitor pad PD1 connected to the structural part SP1, a capacitor pad PD2 arranged to face the capacitor pad PD1 away from the capacitor pad, a structural part SP2 connected to the capacitor pad PD2, and a transmission line TL2 connected to the structural part SP2 are formed on the surface of the wiring board WB. A DC blocking capacitor CAP including a parasitic inductance is mounted over the capacitor pad PD1 and the capacitor pad PD2 so as to be connected to both the capacitor pad PD1 and the capacitor pad PD2.

Each of the transmission line TL1 and the transmission line TL2 extends in the x-direction, and the structural part SP1 is provided at an end portion of the transmission line TL1. Similarly, the structural part SP2 is provided at the end of the transmission line TL2. The planar shape of the structural part SP1 (SP2) is, for example, a rectangular shape. In the Modification 2, the width of the structural part SP1 (SP2) in the y direction is designed to be smaller than the width of the transmission line TL1 (TL2) in the y direction.

Figure 28:
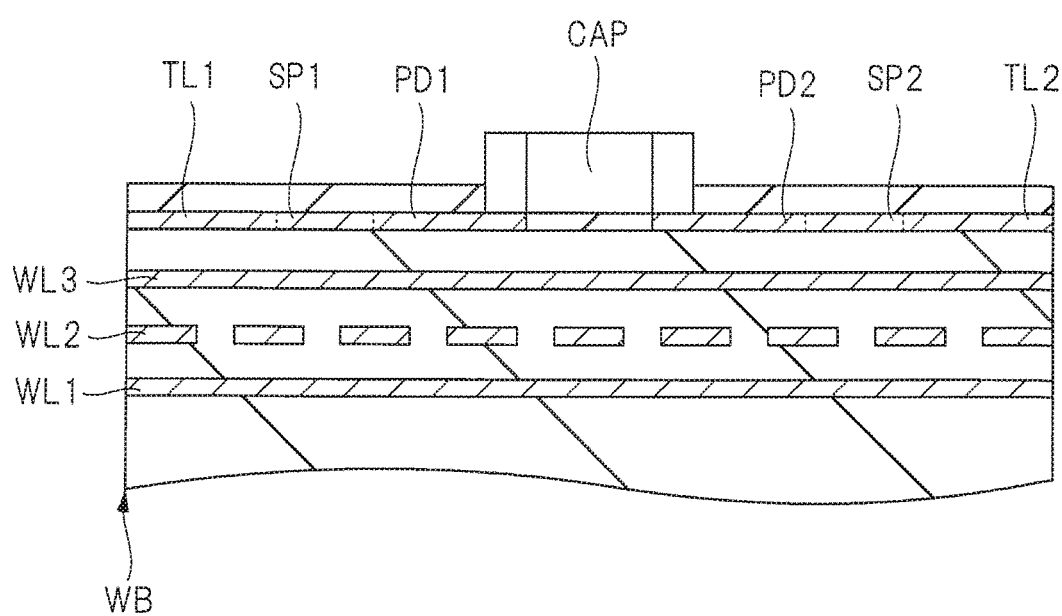
FIG. 28 is a cross-sectional view taken along line A-A of FIG. 27.

FIG. 28 is a cross-sectional view taken along line A-A of FIG. 27.

As shown in FIG. 28, for example, the wiring WL1 is formed in the wiring board WB in the Modification 2, the wiring WL2 is formed in the upper layer of the wiring WL1, and the wiring WL3 is formed in the upper layer of the wiring WL2. The transmission line TL1 and the transmission line TL2 are formed in the same layer on the upper surface of the wiring board WB on the wiring WL3. The structural part SP1 and the capacitor pad PD1 are formed integrally with the transmission line TL1, and the structural part SP2 and the capacitor pad PD2 are formed integrally with the transmission line TL2. Further, a DC cut-off capacitance CAP is mounted so as to be connected to both the capacitor pad PD1 and the capacitor pad PD.

At this time, in FIG. 28, the capacitor pads PD1 (PD2) overlap all of the wirings WL1~WL3 formed inside the wiring board WB in plan view. This point is a characteristic point of the Modification 2. That is, according to the Modification 2, even if the planar area of the capacitor pad PD1 (PD2) is not increased as in the Embodiment 1, the parasitic capacitance between the wirings WL1~WL3 formed inside the wiring board WB and the capacitor pad PD1(PD2) is increased, so that the characteristic impedance of the capacitor pad PD1 (PD2) is made smaller than the characteristic impedance (50Ω) of the transmission line TL1 (TL2). As a result, also in the Modification 2, a band-pass filter is realized in the same manner as in the Embodiment 1. In particular, in the Modification 2, the wiring density of the wirings WL1~WL3 formed inside the wiring board WB can be improved.

Here, in the Modification 2, for example, as shown in FIG. 27, the structural part SP1 is provided between the transmission line TL1 and the capacitor pad PD1, and the structural part SP2 is provided between the transmission line TL2 and the capacitor pad PD2. This configuration is the same as the configuration of the two-stage ladder-pass filter described in Modification 1, but the technical significance of providing the structural part SP1 (SP2) in Modification 2 is different from Modification 1. That is, the structural part SP1 (SP2) of the Modification 1 has a technical significance that by providing the structural part SP1 (SP2), the ladders configure two-stage band-pass filters to realize widening of the transmission band of signals. On the other hand, the structural part SP1 (SP2) in the Modification 2 has a technical significance different from that of the Modification 1. This point will be described below.

In the Modification 2, for example, as shown in FIG. 28, the capacitor pads PD1 (PD2) are configured to overlap all of the wirings WL1~WL3 formed inside the wiring board WB in plan view. As a result, in the Modification 2, the parasitic capacitance between the wirings WL1~WL3 and the capacitor pad PD1 (PD2) is increased, and the characteristic impedance of the capacitor pad PD1 (PD2) is made smaller than the characteristic impedance (50Ω) of the transmission line TL1 (TL2). However, in the configuration of the Modification 2, the parasitic capacitance becomes excessively large, and the characteristic impedances of the capacitor pads PD1 (PD2) become smaller than the optimum values. Therefore, in the Modification 2, a structural part SP1 (SP2) having a characteristic impedance greater than the characteristic impedance of the transmission line TL1 (TL2) is provided. Thus, in the Modification 2, as a result of the configuration of the band-pass filters having two ladders, poles caused by the capacitor pads PD1 (PD2) (portions where the reflective losses are significantly reduced) and poles caused by the structural portions SP1 (SP2) are formed. Here, in the Modification 2, the structural part SP1 (SP2) is designed so that the pole caused by the structural part SP1 (SP2) coincides with the pole caused by the capacitor pads PD1 (PD2). As a result, the characteristic impedances of the capacitor pads PD1 (PD2) are effectively increased. That is, in the Modification 2, the technical significance of providing the structural part SP1 (SP2) is to effectively increase the characteristic impedance of the capacitor pad PD1 (PD2) by making the pole caused by the structural part SP1 (SP2) coincide with the pole caused by the capacitor pad PD1 (PD2). As a result, the characteristic impedances of the capacitor pads PD1 (PD2) which become excessively small by configuring the capacitor pads PD1 (PD2) so as to overlap with all of the wirings WL1~WL3 formed inside the wiring board WB in plan view can be made close to the optimum values. Thus, according to the Modification 2, the transmission band equivalent to that of the Embodiment 1 can be realized while the wiring density inside the wiring board WB is improved.

Figure 29:
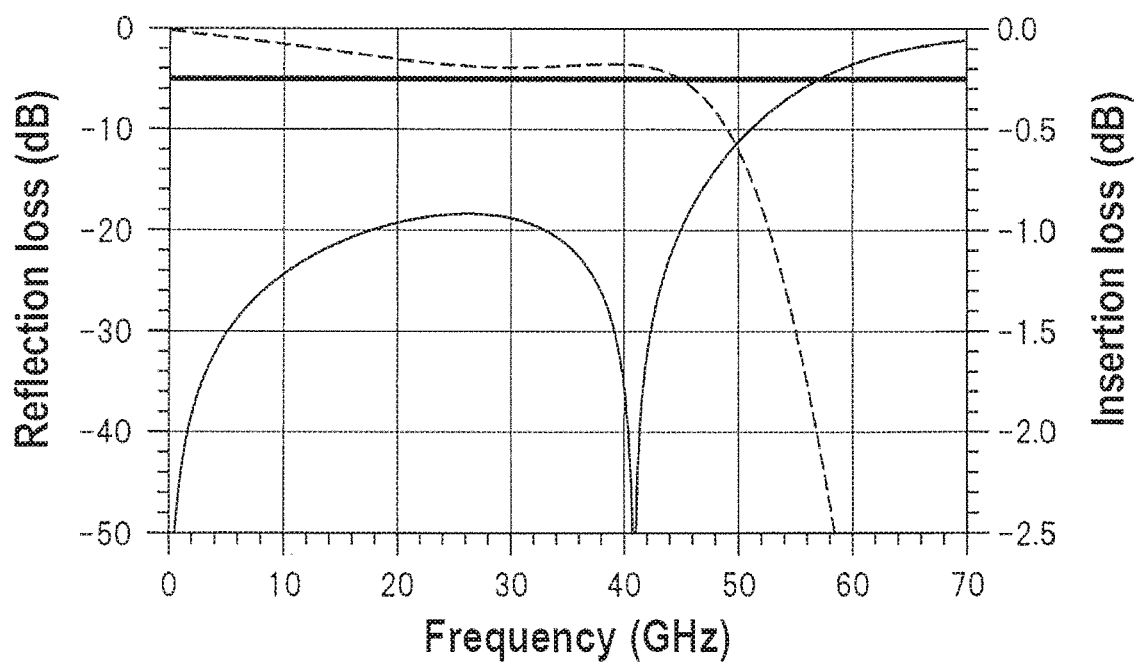
FIG. 29 is a graph showing the relationship between the frequency of the signal and the reflection loss and the frequency of the signal and the insertion loss in the capacitor pad structure of the Modification 2 of the Embodiment 1.

FIG. 29 is a graph showing the relationship between the frequency of the signal and the reflection loss and the frequency of the signal and the insertion loss in the capacitor pad structure of the Modification 2.

In FIG. 29, the horizontal axis represents the frequency of the signal, and the vertical axis represents the reflection loss and the insertion loss. As shown in FIG. 29, it can be seen that a pole whose reflection loss is remarkably reduced exists at a frequency of "40 GHz" in the signal. In the Modification 2, the pole caused by the structural part SP1 (SP2) is made to coincide with the pole caused by the capacitor pads PD1 (PD2). In FIG. 29, focusing on the frequency of the signal and the insertion loss, it is understood that a transmission band of 0.25 dB (97%) can be secured up to a frequency of 45 GHz.

Therefore, it is understood that the transmission band of 40 GHz can be secured in the Modification 2 as in the Embodiment 1.

In the Embodiment 1, an example in which the technical idea in the Embodiment 1 is applied to a single-ended wiring has been described, but the technical idea in the Embodiment 1 is not limited to this and can be applied to, for example, a differential wiring.

Therefore, in the Embodiment 2, an example in which the technical idea in the Embodiment 1 is applied to a differential wiring will be described. In particular, in Embodiment 2, in order to explain the usefulness of applying the technical idea in Embodiment 1 to the differential wiring, first, the related art related to the differential wiring will be explained, and then, the configuration of the differential wiring providing the technical idea in Embodiment 1 (the configuration of the differential wiring in Embodiment 2) will be explained.

The related art explained here corresponds to the countermeasure explained in the Embodiment 1. Specifically, the related art described here focuses on the fact that the characteristic impedance of the capacitor pad is matched with the characteristic impedance of the transmission line by making the planar area of the capacitor pad as small as possible and making the parasitic capacitance of the capacitor pad small.

Figure 30:
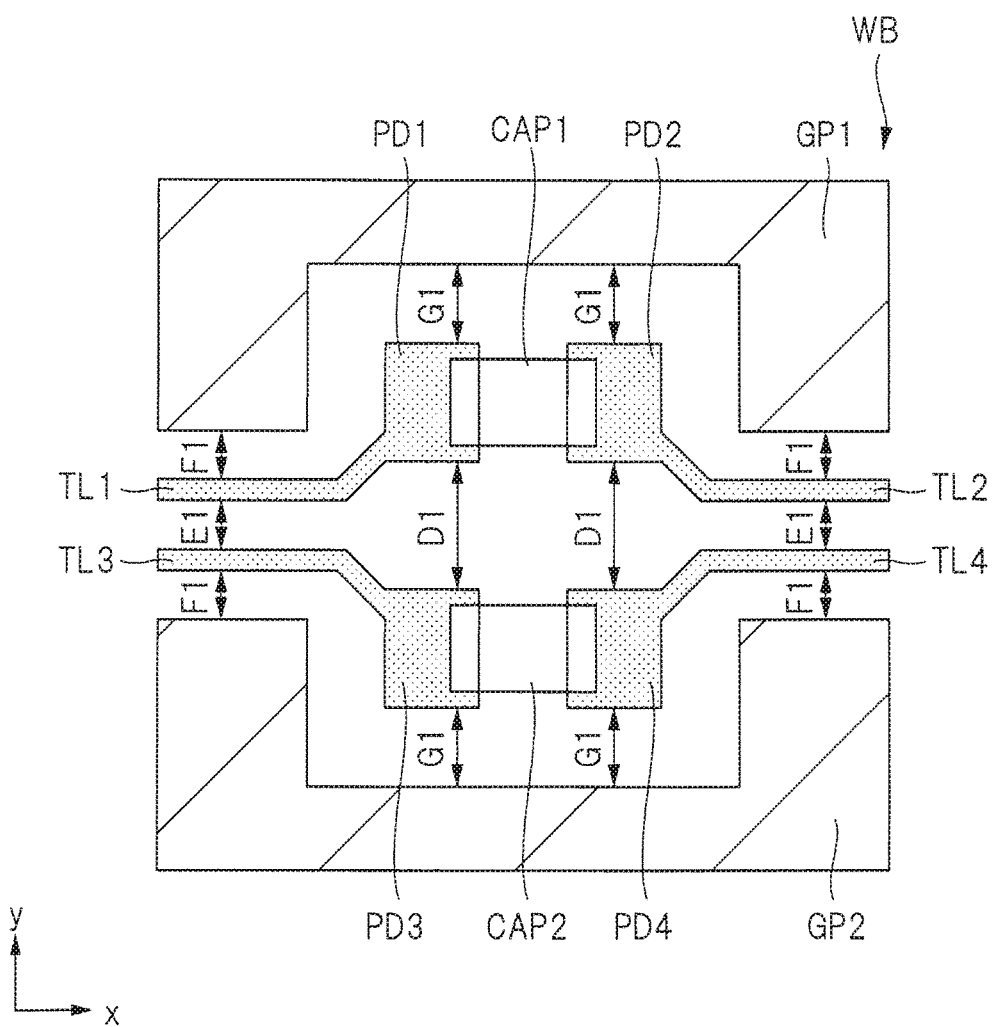
FIG. 30 is a plan view showing a wiring structure in which a DC blocking capacitor is inserted into a differential wiring in the related art.

FIG. 30 is a plan view showing a wiring structure in which a DC blocking capacitor is inserted into a differential wiring in the related art.

In FIG. 30, the transmission line TL1 and the transmission line TL3 extend in the x-direction in parallel with each other, and constitute a differential wire. Similarly, the transmission line TL2 and the transmission line TL4 extend in the x-direction in parallel with each other, and constitute a differential wire. As shown in FIG. 30, the transmission line TL1 is connected to the capacitor pad PD1, while the transmission line TL2 is connected to the capacitor pad PD2. At this time, the capacitor pad PD1 and the capacitor pad PD2 are arranged to face each other in a separated manner, and a DC blocking capacitor CAP1 is provided so as to be connected to the capacitor pad PD1 and the capacitor pad PD2. Similarly, the transmission line TL3 is connected to the capacitor pad PD3, while the transmission line TL4 is connected to the capacitor pad PD4. At this time, the capacitor pad PD3 and the capacitor pad PD4 are arranged to face each other in a separated manner, and a DC blocking capacitor CAP2 is provided so as to be connected to the capacitor pad PD3 and the capacitor pad PD4. Further, in the related art, as shown in FIG. 30, a ground pattern GP1 and a ground pattern GP2 are provided on the outer periphery of the differential wire. As described above, the wiring structure in the related art is configured.

Here, as shown in FIG. 30, in the wiring structures in the related art, the distance in the y direction between the transmission line TL1 and the transmission line TL3 constituting the differential wiring is "E1", and similarly, the distance in the y direction between the transmission line TL2 and the transmission line TL4 constituting the differential wiring is "E1". The distance in the y direction between the capacitor pad PD1 and the capacitor pad PD3 is "D1", and similarly, the distance in the y direction between the capacitor pad PD2 and the capacitor pad PD4 is "D1". At this time, as shown in FIG. 30, in the related art, the distance "D1" is greater than the distance "E1". This is because of the following reasons.

For example, in the related art, the single-end characteristic impedance of the transmission line TL1 substantially matches the single-end characteristic impedance of the capacitor pads PD1. Similarly, in the related art, the single-end characteristic impedance of the transmission line TL2 substantially matches the single-end characteristic impedance of the capacitor pad PD2.

The single-end characteristic impedance of the transmission line TL3 substantially matches the single-end characteristic impedance of the capacitor pad PD3, and the single-end characteristic impedance of the transmission line TL4 substantially matches the single-end characteristic impedance of the capacitor pad PD4.

However, in FIG. 30, since the capacitor pad PD1 (PD2) and the capacitor pad PD3 (PD4) have mutual impedances, if the distance "E1" and the distance "D1" have the same values, the characteristic impedance of the differential wiring formed by the capacitor pad PD1 and the capacitor pad PD3 becomes smaller than the characteristic impedance of the differential wiring formed by the transmission line TL1 and the transmission line TL3. Similarly, when the distance "E1" and the distance "D1" have the same values, the characteristic impedance of the differential wiring formed by the capacitor pad PD2 and the capacitor pad PD4 is smaller than the characteristic impedance of the differential wiring formed by the transmission line TL2 and the transmission line TL4. This is because the electromagnetic coupling between the capacitor pad PD1 (PD2) and the capacitor pad PD3 (PD4) is stronger than the electromagnetic coupling between the transmission line TL1 (TL2) and the transmission line TL3 (TL4) by the greater width in the y-direction.

Therefore, when the distance "E1" and the distance "D1" are equal to each other, a mismatch occurs between the characteristic impedance of the differential wiring formed by the transmission line TL1 (TL2) and the transmission line TL3 (TL4) and the characteristic impedance of the differential wiring formed by the capacitor pad PD1 (PD2) and the capacitor pad PD3 (PD4).

Therefore, in the related art, for example, as shown in FIG. 30, the distance "D1" in the y direction between the capacitor pad PD1 (PD2) and the capacitor pad PD3 (PD4) is made greater than the distance "E1" in the y direction between the transmission line TL1 (TL2) and the transmission line TL3 (TL4). With this configuration, the characteristic impedance of the differential wiring formed by the capacitor pad PD1 (PD2) and the capacitor pad PD3 (PD4) can be matched with the characteristic impedance of the differential wiring formed by the transmission line TL1 (TL2) and the transmission line TL3(TL4). This is because the characteristic impedance of the differential wiring becomes smaller as the distance between the pair of wirings constituting the differential wiring becomes smaller. In other words, the characteristic impedance of the differential wiring increases as the distance between the pair of wirings constituting the differential wiring increases. That is, in the related art, the decrease in the characteristic impedance of the differential wire caused by the strong electromagnetic coupling between the capacitor pad PD1 (PD2) and the capacitor pad PD3 (PD4) is offset by the increase in the characteristic impedance by making the distance "D1" in the y direction between the capacitor pad PD1 (PD2) and the capacitor pad PD3 (PD4) greater than the distance "E1" in the y direction between the transmission line TL1 (TL2) and the transmission line TL3 (TL4). As a result, in the related art, the characteristic impedance of the differential wiring composed of the capacitor pad PD1 (PD2) and the capacitor pad PD3 (PD4) is matched with the characteristic impedance of the differential wiring composed of the transmission line TL1 (TL2) and the transmission line TL3 (TL4), thereby eliminating the mismatch of the characteristic impedance.

For the same reason, for example, as shown in FIG. 30, in the related art, the distance "G1" in the y direction between the ground pattern GP1 (GP2) and the capacitor pads PD1 (PD3) is made greater than the distance "F1" in the y direction between the ground pattern GP1 (GP2) and the transmission line TL1 (TL3). Further, the distance "G1" in the y direction between the ground pattern GP1 (GP2) and the capacitor pads PD2 (PD4) is made greater than the distance "F1" in the y direction between the ground pattern GP1 (GP2) and the transmission line TL2 (TL4). However, the mutual impedance to be considered here is the mutual impedance between the capacitor pad and the ground pattern.

As described above, the wiring structure in the related art is configured.

Figure 31:
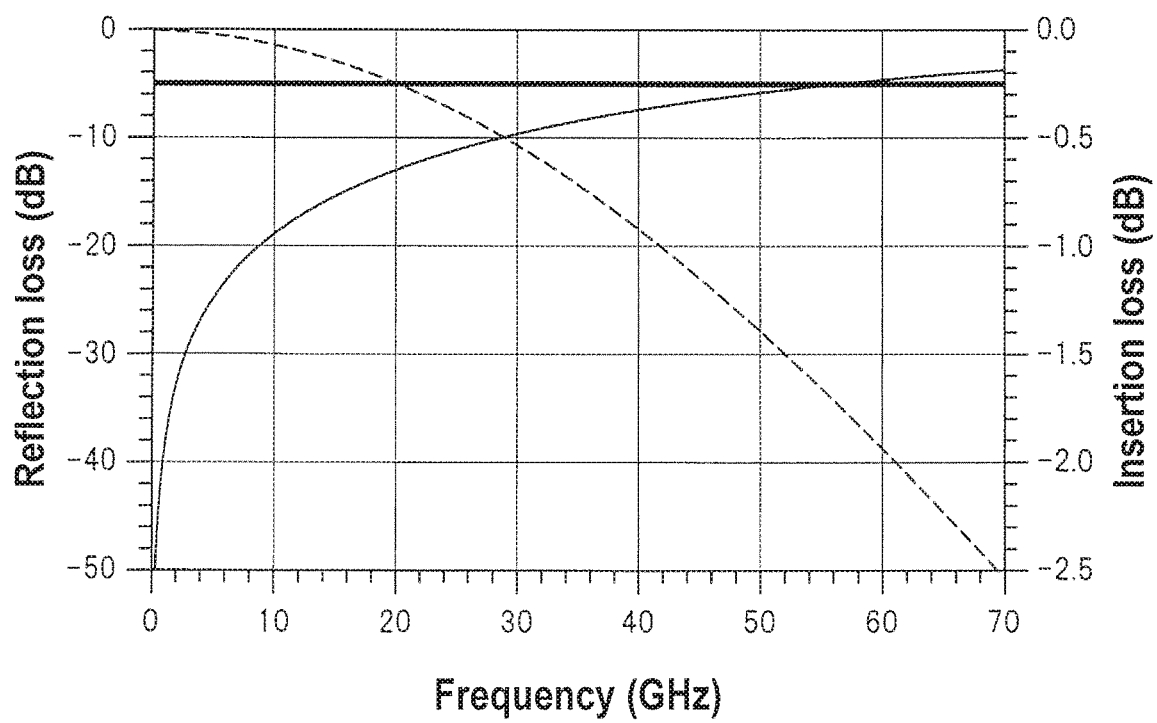
FIG. 31 is a graph showing the relationship between the frequency of a signal transmitting through a transmission line having a structure in which a DC cut-off capacitor is mounted and the reflection loss of the signal and the insertion loss of the signal in the related art.

FIG. 31 is a graph showing the relationship between the frequency of a signal transmitting through a transmission line having a DC cut-off capacitor mounting structure in the related art (see FIG. 30), and the reflection loss of the signal and the insertion loss of the signal.

In FIG. 31, focusing on the relationship between the frequency of the signal and the reflection loss of the signal, as the frequency of the signal increases, the reflection loss of the signal also increases. Next, in FIG. 31, when attention is paid to the relationship between the frequency of the signal and the insertion loss of the signal, the insertion loss of the signal increases as the frequency of the signal increases, but from the graph showing the insertion loss in FIG. 31, it is understood that the transmission band of 0.25 dB (97%) is about 20 GHz in the related art. As described above, the related art is effective for signal transmission having a transmission band of about 20 GHz. However, in signal transmission having a transmission band exceeding 20 GHz, transmission loss (reflection loss and insertion loss) becomes large, and therefore it is necessary to devise. Therefore, in the Embodiment 2, as in the Embodiment 1, when signal transmission having a transmission band exceeding 20 GHz is realized by the differential wiring, the parasitic inductance of the DC cutoff capacitor CAP is not removed, but conversely, the parasitic inductance is actively used to improve the signal transmission performance in the differential wiring. Hereinafter, the wiring structure in the Embodiment 2 to which this device is applied will be described.

Figure 32:
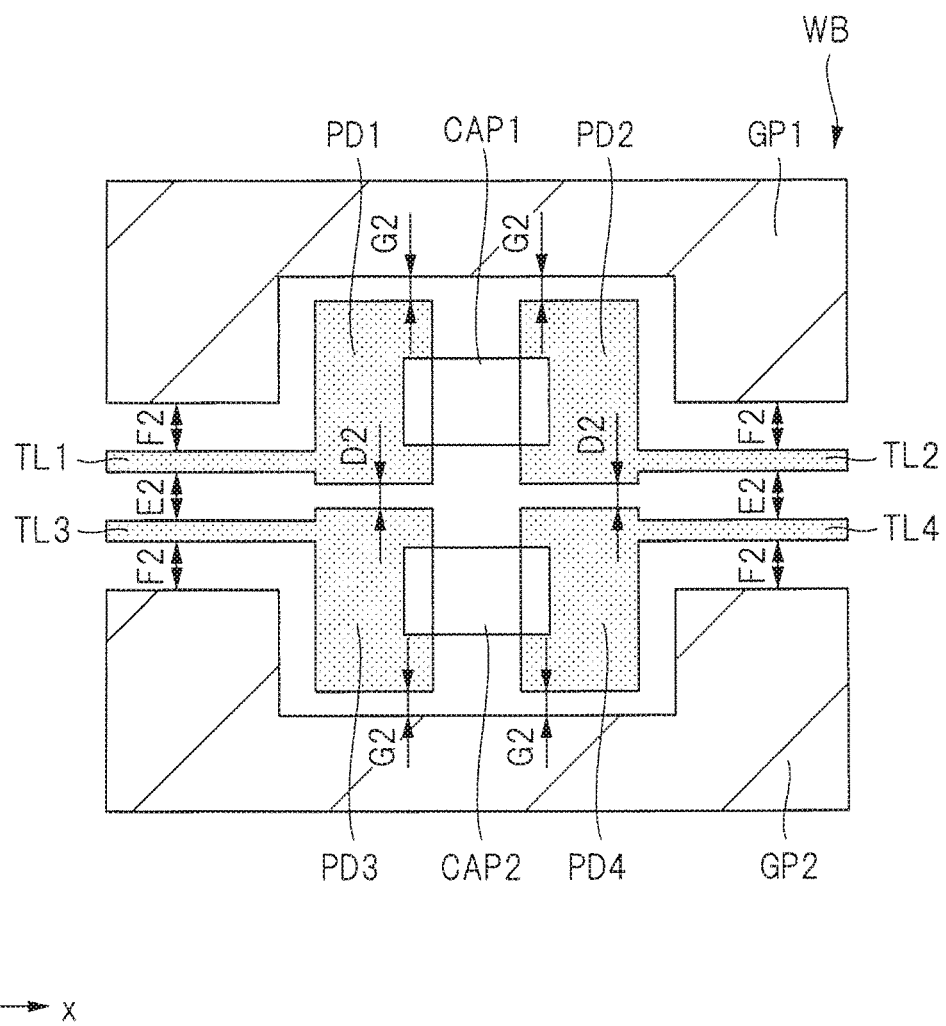
FIG. 32 is a plan view showing a wiring structure in which a DC blocking capacitor is inserted into a differential wiring in Embodiment 2.

FIG. 32 is a plan view showing a wiring structure in which a DC blocking capacitor is inserted into the differential wiring in Embodiment 2.

In FIG. 32, the transmission line TL1 and the transmission line TL3 extend in the x-direction in parallel with each other, and constitute a differential wire. Similarly, the transmission line TL2 and the transmission line TL4 extend in the x-direction in parallel with each other, and constitute a differential wire. As shown in FIG. 32, the transmission line TL1 is connected to the capacitor pad PD1, while the transmission line TL2 is connected to the capacitor pad PD2. At this time, the capacitor pad PD1 and the capacitor pad PD2 are arranged to face each other in a separated manner, and the DC blocking capacitor CAP1 including a parasitic inductance is provided so as to be connected to the capacitor pad PD1 and the capacitor pad PD2. Similarly, the transmission line TL3 is connected to the capacitor pad PD3, while the transmission line TL4 is connected to the capacitor pad PD4. At this time, the capacitor pad PD3 and the capacitor pad PD4 are arranged to face each other in a separated manner, and the DC blocking capacitor CAP2 including a parasitic inductance is provided so as to be connected to the capacitor pad PD3 and the capacitor pad PD4. Further, in the Embodiment 2, as shown in FIG. 32, the ground pattern GP1 and the ground pattern GP2 are provided on the outer periphery of the differential wirings. As described above, the wiring structure in the Embodiment 2 is configured.

Here, as illustrated in FIG. 32, in the wiring board according to the second exemplary embodiment, the distance in the y-direction between the transmission line TL1 constituting the differential wiring and the transmission line TL3 is "E2," and similarly, the distance in the y-direction between the transmission line TL2 constituting the differential wiring and the transmission line TL4 is "E2". The distance in the y direction between the capacitor pad PD1 and the capacitor pad PD3 is "D2", and similarly, the distance in the y direction between the capacitor pad PD2 and the capacitor pad PD4 is "D2". At this time, as shown in FIG. 32, in the Embodiment 2, the distance "D2" is smaller than the distance "E2".

Further, in the wiring board according to the second exemplary embodiment, the distance in the y-direction between the transmission line TL1 (TL3) and the ground pattern GP1 (GP2) is "F2," and similarly, the distance in the y-direction between the transmission line TL2 (TL4) and the ground pattern GP1 (GP2) is "F2". The distance in the y direction between the capacitor pad PD1 (PD3) and the ground pattern GP1 (GP2) is "G2", and similarly, the distance in the y direction between the capacitor pad PD2 (PD4) and the ground pattern GP1 (GP2) is "G2".

As shown in FIG. 32, in the Embodiment 2, the distance "G2" is smaller than the distance "F2". Further, in the interconnection configuration in the Embodiment 2, as shown in FIG. 32, the distance between the transmission line TL1 and the transmission line TL3 is constant up to a position where the transmission line TL1 is connected to the capacitor pad PD1 and the transmission line TL3 is connected to the capacitor pad PD3. Similarly, in the wiring structure in the Embodiment 2, the distance between the transmission line TL2 and the transmission line TL4 is constant up to the position where the transmission line TL2 is connected to the capacitor pad PD2 and the transmission line TL4 is connected to the capacitor pad PD4.

Also in the wiring structure in the Embodiment 2, the basic idea of the Embodiment 1 that the bandpass filter is configured by changing the characteristic impedance depending on the location is embodied. That is, in FIG. 32, the width of each of the capacitor pads PD1~PD4 in the y direction is made greater than the width of the DC cut-off capacitor CAP1 (CAP2) in the y direction, thereby enlarging the flat area of each of the capacitor pads PD1~PD4. Thus, for example, the characteristic impedance of the differential wiring composed of the capacitor pad PD1 and the capacitor pad PD3 can be made smaller than the characteristic impedance of the differential wiring composed of the transmission line TL1 and the transmission line TL3. As a result, in the Embodiment 2, each of the capacitor pads PD1~PD4 can be used as a component of the band-pass filters.

Here, in order to configure the band-pass filters, the respective planar areas of the capacitor pads PD1~PD4 need to be increased, but appropriate ranges also exist in these planar areas. However, although the wiring structure according to the second exemplary embodiment needs to increase the flat area of each of the capacitor pads PD1~PD4, it is not necessary to increase the flat area of each of the capacitor pads PD1~PD4 until the wiring structure (single-end configuration) according to the first exemplary embodiment is within an appropriate range (e.g., 0.20 mm$^2$ to 0.40 mm$^2$ in FIG. 21).

This is because in the wiring structure of the Embodiment 2, for example, the capacitor pad PD1 and the capacitor pad PD3 comprise a differential wiring, and as shown in FIG. 32, the width "D2" in the y-direction between the capacitor pad PD1 and the capacitor pad PD3 constituting the differential wiring is smaller than the width "E2" in the y-direction between the transmission line TL1 constituting the differential wiring and the transmission line TL3. That is, the characteristic impedance of the differential wiring becomes smaller as the distance between the wirings constituting the differential wiring becomes smaller. Therefore, as shown in FIG. 32, by making the width "D2" in the y direction between the capacitor pad PD1 and the capacitor pad PD3 smaller than the width "E2" in the y direction between the transmission line TL1 and the transmission line TL3, the characteristic impedance of the differential wiring composed of the capacitor pad PD1 and the capacitor pad PD3 becomes smaller than the characteristic impedance of the differential wiring composed of the transmission line TL1 and the transmission line TL3. As a result, even if the planar area of each of the capacitor pads PD1~PD4 is not increased to an appropriate range in the wiring configuration in the Embodiment 1, the characteristic impedance of the differential wiring structure of the capacitor pad PD1 and the capacitor pad PD3 can be reduced to a range functioning as a band pass filter by a synergistic effect with the characteristic impedance reduction effect caused by reducing the width "D2" in the y-direction between the capacitor pad PD1 and the capacitor pad PD3. That is, in the wiring structure according to the Embodiment 2, not only the effect of reducing the characteristic impedance caused by enlarging the respective planar areas of the capacitor pads PD1~PD4, but also the effect of reducing the characteristic impedance caused by reducing the distances between the capacitor pads in the y-direction can be utilized.

Further, in the wiring structure in the Embodiment 2, the effect of reducing the characteristic impedance caused by the mutual impedance between the capacitor pads by reducing the distance "G2" between the capacitor pads and the ground pattern is also utilized.

As a result, in the wiring structure in the Embodiment 2, it is possible to reduce the characteristic impedance to a range functioning as a band-pass filter, while reducing the respective flat areas of the capacitor pads PD1~PD4, as compared with the wiring structure in which only the characteristic impedance reduction effect caused by enlarging the respective flat areas of the capacitor pads PD1~PD4 is used. As a result, according to the wiring structure in the Embodiment 2, it is possible to improve the signal transmission performance in the differential wiring while reducing the wiring structure composed of the differential wiring.

Figure 33:
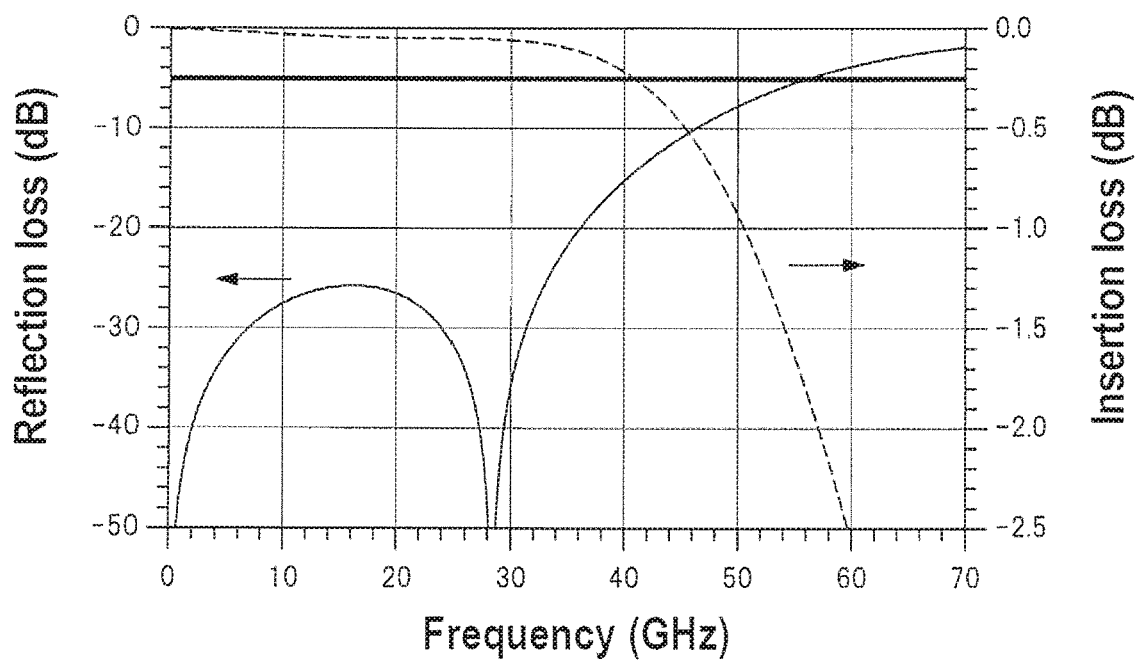
FIG. 33 is a graph showing the relationship between the frequency of the signal transmitting through the differential wiring and the reflection loss of the signal and the insertion loss of the signal in the Embodiment 2.

FIG. 33 is a graph showing the relationship between the frequency of the signal transmitting through the differential wiring and the reflection loss of the signal and the insertion loss of the signal in the Embodiment 2.

In the wiring configuration of the differential wiring in the Embodiment 2 shown in FIG. 32, the parasitic inductances of the DC cutoff capacitors CAP1 (CAP2) and the capacities of the capacitor pads PD1~PD4 constitute band-pass filters. Thus, in FIG. 33, when focusing on the relationship between the frequency of the signal and the reflection loss of the signal, it can be seen that a pole in which the reflection loss is remarkably reduced due to the configuration of the band-pass filter is formed in the vicinity of the frequency of 28 GHz, for example. Therefore, as shown in FIG. 32, the reflection loss is also reduced in the frequency band near this frequency. As a result, in FIG. 33, focusing on the relationship between the frequency of the signal and the insertion loss of the signal, the insertion loss of the signal increases as the frequency of the signal increases, but it is understood from the graph showing the insertion loss in FIG. 33 that the transmission band of 0.25 dB (97%) is improved to about 40 GHz in the Embodiment 2. That is, in the related art shown in FIG. 31, the transmission band of 0.25 dB (97%) is about 20 GHz, whereas in the Embodiment 2 shown in FIG. 33, the transmission band of 0.25 dB (97%) is improved to about 40 GHz. From this, it can be understood that by adopting the basic idea of the Embodiment 1 also for the differential wiring, transmission loss (reflection loss and insertion loss) in signal transmission having a transmission band exceeding 20 GHz can be reduced, for example.

In Modification 1, a technical idea for realizing a wide transmission band by configuring a band-pass filter having two ladder stages will be described.

Figure 34:
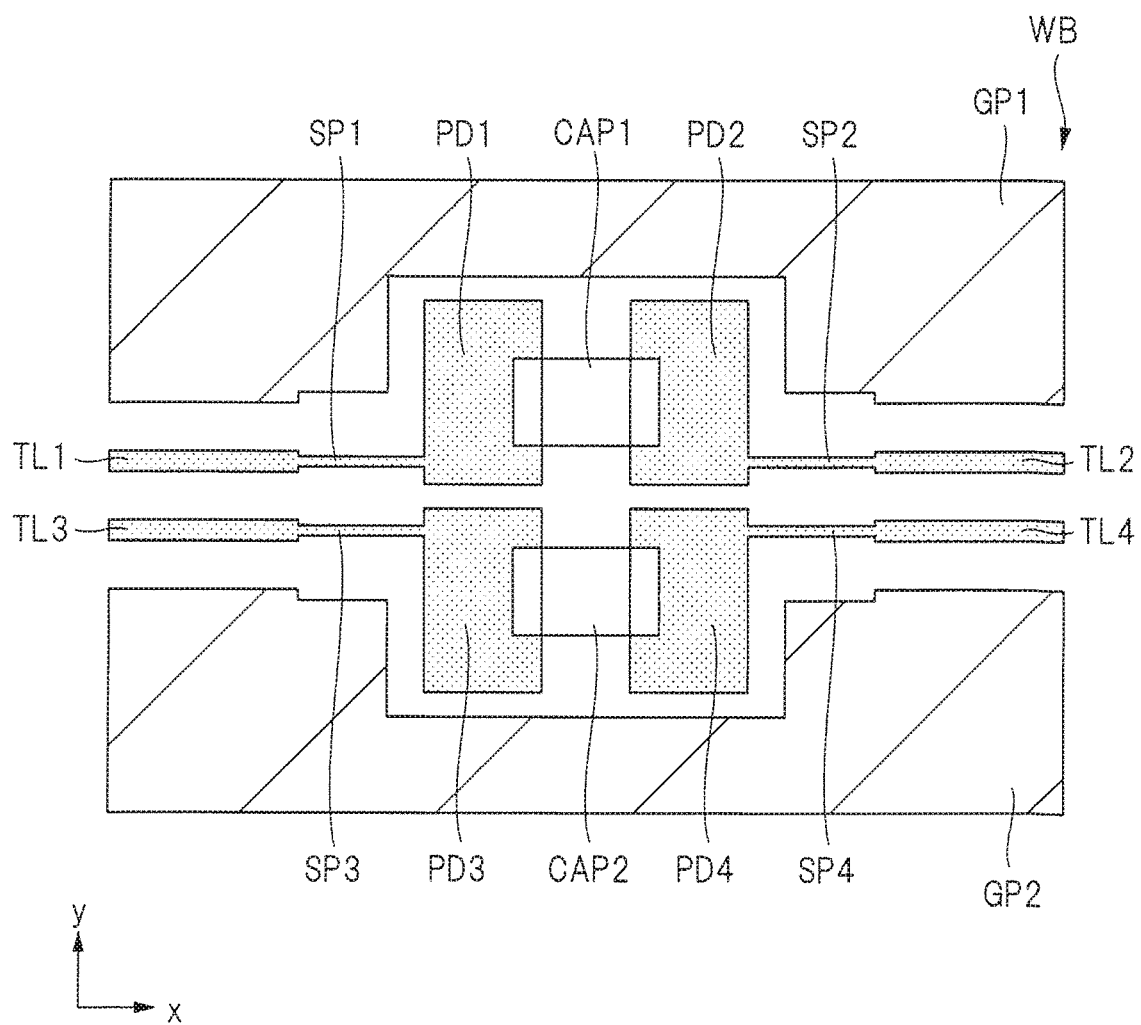
FIG. 34 is a plan view showing a wiring structure constituting a differential wiring in Modification 1 of Embodiment 2.

FIG. 34 is a plan view showing a wiring structure constituting the differential wiring in the Modification 1.

In FIG. 34, a structural part SP1 connected to both the capacitor pad PD1 and the transmission line TL1 and provided between the capacitor pad PD1 and the transmission line TL1, and a structural part SP2 connected to both the capacitor pad PD2 and the transmission line TL2 and provided between the capacitor pad PD2 and the transmission line TL2 are formed on the surface of the wiring board WB. Further, a structural part SP3 connected to both the capacitor pad PD3 and the transmission line TL3 and provided between the capacitor pad PD3 and the transmission line TL3, and a structural part SP4 connected to both the capacitor pad PD4 and the transmission line TL4 and provided between the capacitor pad PD4 and the transmission line TL4 are formed on the upper surface of the wiring board WB.

As shown in FIG. 34, the width of the structural part SP1 in the y direction is smaller than the width of the transmission line TL1 in the y direction, and the width of the structural part SP2 in the y direction is smaller than the width of the transmission line TL2 in the y direction. Similarly, the width of the structural part SP3 in the y direction is smaller than the width of the transmission line TL3 in the y direction, and the width of the structural part SP4 in the y direction is smaller than the width of the transmission line TL4 in the y direction. Thus, for example, the characteristic impedance of the differential wiring composed of the structural part SP1 (SP2) and the structural part SP3 (SP4) can be made greater than the characteristic impedance of the differential wiring composed of the transmission line TL1 (TL2) and the transmission line TL3(TL4). In the Modification 1, the effect of reducing the characteristic impedance caused by increasing the respective planar areas of the capacitor pads PD1~PD4 and the effect of reducing the characteristic impedance caused by decreasing the distances between the capacitor pads in the y-direction are used. As a result, in the Modification 1, the characteristic impedance of the differential wiring composed of the capacitor pad PD1(PD2) and the capacitor pad PD3 (PD4) can be made smaller than the characteristic impedance of the differential wiring composed of the transmission line TL1 (TL2) and the transmission line TL3 (TL4). In this manner, in the Modification 1, a configuration in which the characteristic impedance is changed depending on the location between the input end and the output end is realized, and a band-pass filter in which the number of ladder stages is two is realized. In other words, the DC cut-off capacitance CAP, the capacitor pads PD1 (PD2), and the structural part SP1 (SP2) realize two-stage band-pass filters.

Figure 35:
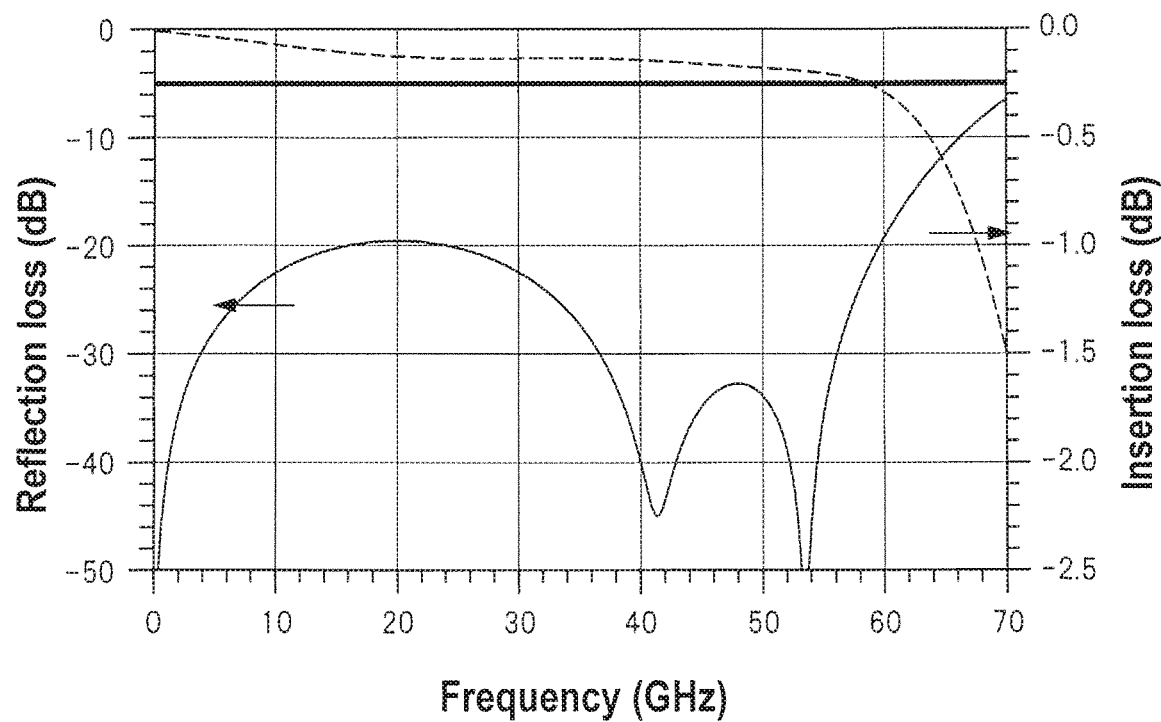
FIG. 35 is a graph showing the relationship between the frequency of the signal and the reflection loss, and the frequency of the signal and the insertion loss in the differential wiring in Modification 1 of Embodiment 2.

FIG. 35 is a graph showing the relationship between the frequency of the signal and the reflection loss and the frequency of the signal and the insertion loss in the differential wiring in the Modification 1.

In FIG. 35, focusing on the frequency of the signal and the reflection loss, it is understood that the reflection loss is remarkably reduced at the frequency of "41 GHz" and the frequency of "54 GHz". In other words, in the band-pass filter having two ladder stages in the Modification 1, two poles are formed in which the reflection loss is remarkably reduced except for the DC point (frequency: 0). As a result, as shown in FIG. 35, the reflection loss is reduced to 60 GHz. That is, as in the Modification 1, in the band-pass filter having two ladder stages, two poles are formed in which reflection loss is remarkably reduced except for the DC point (frequency: 0). As a result, for example, as can be seen from a comparison between FIG. 33 and FIG. 35, the reflection loss can be reduced over a wide frequency band in a band-pass filter in which the number of poles at which the reflection loss is remarkably reduced is large except for the DC point (the frequency is 0). As a result, in FIG. 35, focusing on the frequency of the signal and the insertion loss, a transmission band of 0.25 dB (97%) can be secured up to a frequency of 60 GHz. As described above, since the number of poles at which the reflection loss is remarkably reduced is increased by one in the band-pass filter having two stages of the ladder as compared with the band-pass filter having one stage of the ladder, the reflection loss can be reduced over a wide frequency band, and as a result, the transmission band of the signal can be widened.

The Modification 2 in the Embodiment 2 will be described following the Modification 2. Modification 2 in Embodiment 2 is a technical idea corresponding to Modification 2 in Embodiment 1.

Figure 36:
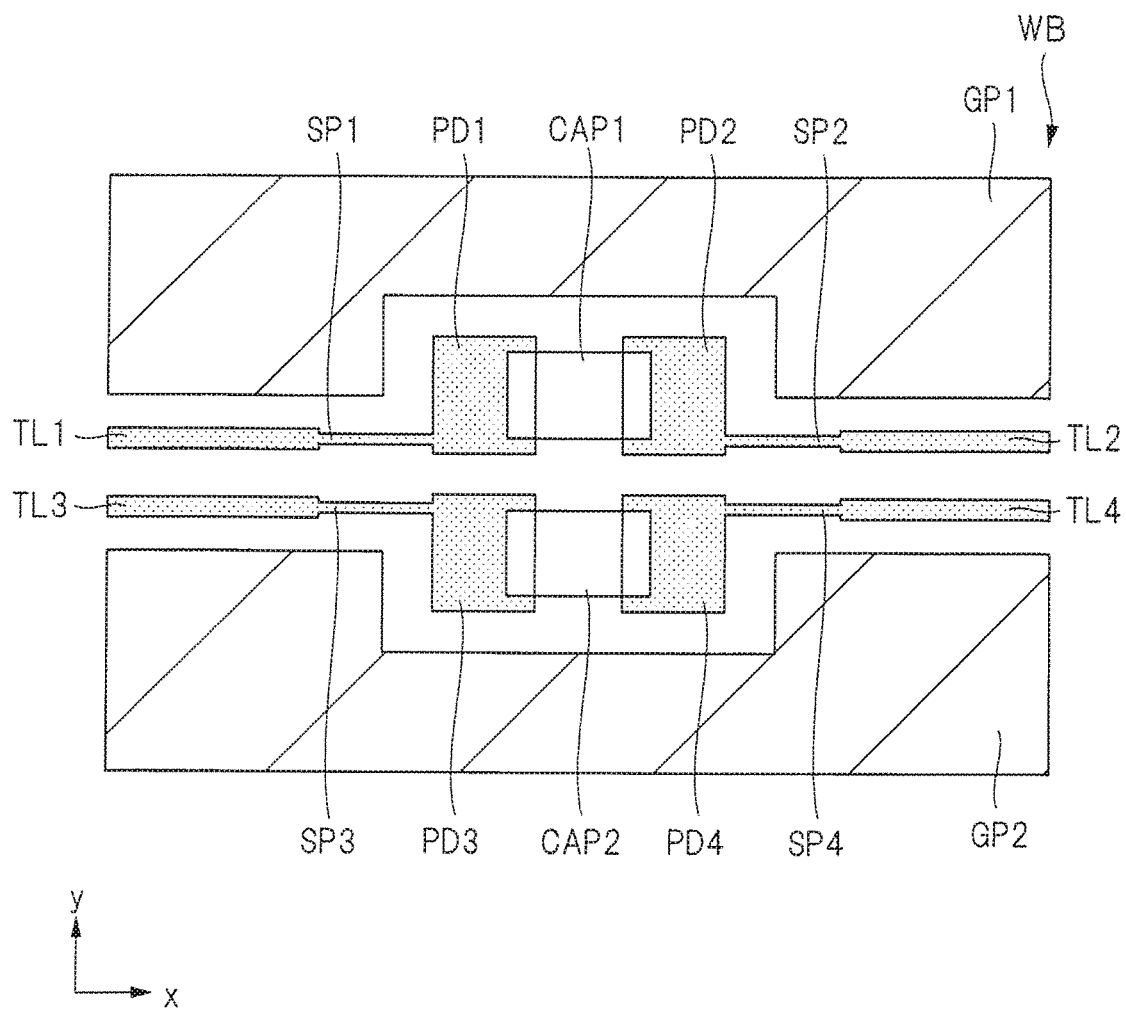
FIG. 36 is a plan view showing a wiring structure constituting a differential wiring in Modification 2 of Embodiment 2.

FIG. 36 is a plan view showing a wiring structure constituting the differential wiring in the Modification 2.

In FIG. 36, a structural part SP1 connected to both the capacitor pad PD1 and the transmission line TL1 and provided between the capacitor pad PD1 and the transmission line TL1, and a structural part SP2 connected to both the capacitor pad PD2 and the transmission line TL2 and provided between the capacitor pad PD2 and the transmission line TL2 are formed on the upper surface of the wiring board WB. Further, a structural part SP3 connected to both the capacitor pad PD3 and the transmission line TL3 and provided between the capacitor pad PD3 and the transmission line TL3, and a structural part SP4 connected to both the capacitor pad PD4 and the transmission line TL4 and provided between the capacitor pad PD4 and the transmission line TL4 are formed on the upper surface of the wiring board WB.

Further, although not shown in FIG. 36, inside the wiring board WB, there are provided a first wiring layer in which a first internal wiring is formed, a second wiring layer provided on the first wiring layer and in which a second internal wiring is formed, a third wiring layer in which a third internal wiring is formed, and a fourth wiring layer provided on the third wiring layer and in which a fourth internal wiring is formed.

At this time, in the Modification 2, the first internal wiring formed in the first wiring layer has a portion overlapping with the capacitor pad PD1 and the capacitor pad PD2 in plan view, and the second internal wiring formed in the second wiring layer has a portion overlapping with the capacitor pad PD1 and the capacitor pad PD2 in plan view. Similarly, in plan view, the third internal wiring formed in the third wiring layer has a portion overlapping with the capacitor pad PD3 and the capacitor pad PD4, and in plan view, the fourth internal wiring formed in the fourth wiring layer has a portion overlapping with the capacitor pad PD3 and the capacitor pad PD4.

Figure 37:
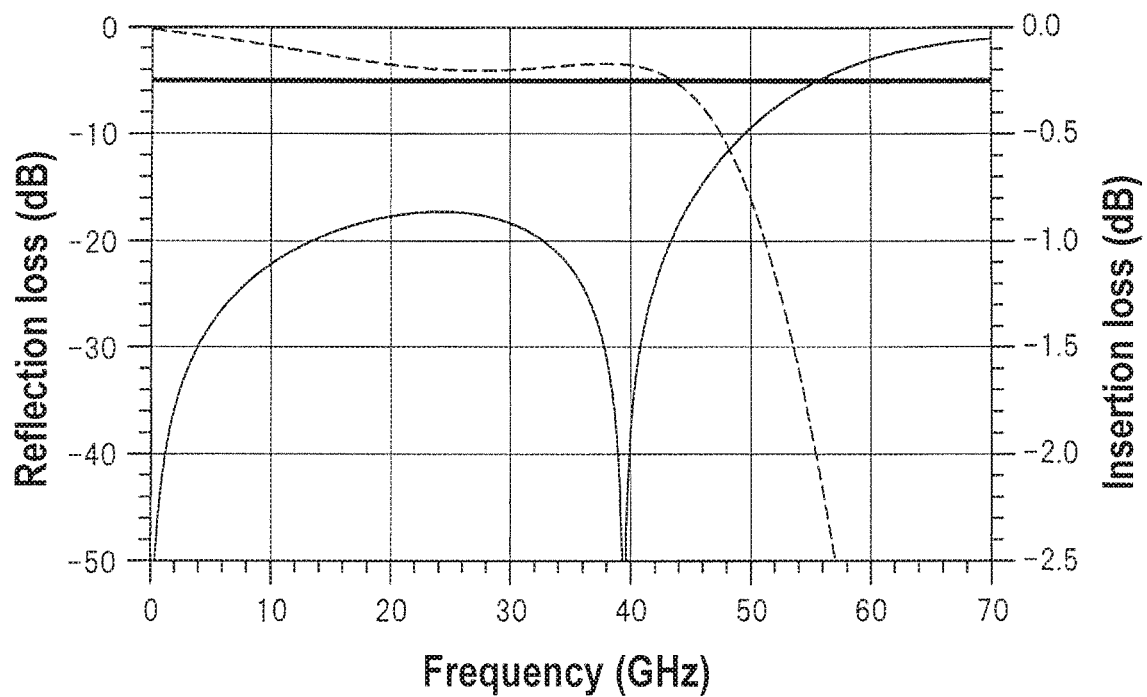
FIG. 37 is a graph showing the relationship between the frequency of the signal and the reflection loss and the frequency of the signal and the insertion loss in the capacitor pad structure of the Modification 2 of the Embodiment 2.

FIG. 37 is a graph showing the relationship between the frequency of the signal and the reflection loss and the frequency of the signal and the insertion loss in the capacitor pad structure of the Modification 2. In FIG. 37, the horizontal axis represents the frequency of the signal, and the vertical axis represents the reflection loss and the insertion loss. As shown in FIG. 37, it can be seen that a pole whose reflection loss is remarkably reduced exists at a frequency of "40 GHz" in the signal. In the Modification 2, the pole caused by the structural part SP1~SP4 is made to coincide with the pole caused by the capacitor pads PD1~PD4. In FIG. 37, focusing on the frequency of the signal and the insertion loss, it is understood that a transmission band of 0.25 dB (97%) can be secured up to a frequency of 44 GHz. Therefore, it is understood that the transmission band of 40 GHz can be secured in the Modification 2 as well as in the Embodiment 2.

In particular, the wiring structures in the Modification 2 utilize the effect of reducing the characteristic impedance caused by reducing the distances between the capacitor pads in the y-direction without increasing the respective planar areas of the capacitor pads PD1~PD4, and the effect of reducing the characteristic impedance caused by increasing the parasitic capacitance between the internal wiring (upper internal wiring) and the capacitor pads PD1~PD4. Thus, in the Modification 2, it is possible to reduce the characteristic impedance of the differential wiring composed of the capacitor pad to a range suitable for the configuration of the band-pass filter. Thus, according to the Modification 2, it is possible to improve the signal transmission performance in the differential wiring while reducing the wiring structure composed of the differential wiring.

The invention made by the present inventor has been described above in detail based on the embodiment, but the present invention is not limited to the embodiment described above, and it is needless to say that various modifications can be made without departing from the gist thereof.

The embodiment comprises the following modes.

A semiconductor device comprising a wiring board, wherein the wiring board comprises a first wiring through which a high-frequency signal transmits, a first capacitor pad connected to the first wiring, a second capacitor pad arranged to face the first capacitor pad apart from the first capacitor pad, a second wiring connected to the second capacitor pad, and a capacitive component connected to both the first capacitor pad and the second capacitor pad and including a parasitic inductance, and the transmission line between the first wiring and the modification wiring includes the first capacitor pad, the second capacitor pad, and the capacitive component, and the transmission line functions as a band pass filter by varying the characteristic impedance of the transmission line depending on the location.

A semiconductor device comprising a wiring board, wherein the wiring board has: a first wiring extending in a first direction; a first capacitor pad electrically connected to the first wiring; a second capacitor pad arranged to face the first capacitor pad apart from the first capacitor pad; a second wiring electrically connected to the second capacitor pad and extending in the first direction; a first capacitive component connected to both the first capacitor pad and the second capacitor pad extending in the first direction and including a parasitic inductance; a third wiring extending in the first direction in parallel with the first wiring; a third capacitor pad electrically connected to the third wiring; a fourth capacitor pad arranged to face the third capacitor pad spaced apart from the third capacitor pad; a fourth capacitor pad electrically connected to the fourth capacitor pad and extending in the first direction in parallel with the second wiring; and a second capacitive component connected to both the third capacitor pad and the fourth capacitor pad and the parasitic inductance. The semiconductor device, wherein the first wiring and the third wiring constitute a differential wiring, the second wiring and the fourth wiring constitute a differential wiring, and in a second direction orthogonal to the first direction, a distance between the first capacitor pad and the third capacitor pad is smaller than a distance between the first wiring and the third wiring, and in a second direction orthogonal to the first direction, a distance between the second capacitor pad and the fourth capacitor pad is smaller than a distance between the second wiring and the fourth wiring.

In the semiconductor device described in Appendix 2, the distance between the first wiring and the third wiring is constant, and the distance between the second wiring and the fourth wiring is also constant.

In the semiconductor device described in Appendix 2, the wiring board further comprises: a first ground pattern disposed closer to the first wiring and the second wiring, the first capacitor pad, and the second capacitor pad than to the third wiring and the fourth wiring, the third capacitor pad, and the fourth capacitor pad; a second ground pattern disposed closer to the third wiring and the fourth wiring, the first capacitor pad, and the second capacitor pad than to the first wiring and the first capacitor pad and the second capacitor pad; in the second direction, a distance between the first ground pattern and the first capacitor pad is smaller than a distance between the first ground pattern and the first wiring and the first capacitor pad, and in the second direction, a distance between the first ground pattern and the second capacitor pad is smaller than a distance between the first ground pattern and the second wiring and the second capacitor pad is smaller than a distance between the first ground pattern and the second wiring, and in the second direction is smaller than a distance between the first ground pattern and the second wiring. A semiconductor device in which a distance between the second ground pattern and the third capacitor pad is smaller than a distance between the second ground pattern and the third wiring, and a distance between the second ground pattern and the fourth capacitor pad is smaller than a distance between the second ground pattern and the fourth wiring in the second direction.

In the semiconductor device according to Appendix 2, the wiring board has: a first structural part connected to both of the first capacitor pad and the first wiring, and provided between the first capacitor pad and the first wiring; a second structural part connected to both of the second capacitor pad and the second wiring, and provided between the second capacitor pad and the second wiring; a third structural part connected to both of the third capacitor pad and the third wiring, and provided between the third capacitor pad and the third wiring; and a fourth structural part connected to both of the fourth capacitor pad and the fourth wiring, and provided between the fourth capacitor pad and the fourth wiring, wherein a width of the first structural part in the second direction is smaller than a width of the first wiring in the second direction, and a width of the second structural part in the second direction is smaller than a width of the first wiring in the second direction, and a width of the second structural part in the second direction is smaller than a width of the second wiring in the second wiring in the second direction The semiconductor device, wherein a width of the fourth structural portion in the second direction is smaller than a width of the third wiring in the second direction, and wherein a width of the fourth structural portion in the second direction is smaller than a width of the fourth wiring in the second direction.

(Appendix 6)

In the semiconductor device according to Appendix 2, in the wiring board, a first wiring layer provided inside the wiring board, a second wiring layer provided inside the wiring board and provided on the first wiring layer, a third wiring layer provided inside the wiring board, a fourth wiring layer provided inside the wiring board and provided on the third wiring layer, the first wiring provided on the surface of the wiring board, the second wiring provided on the surface of the wiring board, the third wiring provided on the surface of the wiring board, the third wiring provided on the surface of the wiring board, the fourth wiring provided on the surface of the wiring board, the first capacitor pad provided on the surface of the wiring board, the second capacitor pad provided on the surface of the wiring board, the third capacitor pad provided on the surface of the wiring board, the third capacitor pad provided on the surface of the wiring board, the fourth capacitor pad provided on the surface of the wiring board, the first capacitor pad provided on the surface of the wiring board, the first capacitor pad provided on the surface of the wiring board, and the first capacitor pad provided on the surface of the first wiring board A semiconductor device in which the second structure portion provided on the surface of the wiring board, the third structure portion provided on the surface of the wiring board, and the fourth structure portion provided on the surface of the wiring board are formed, and the first internal wiring formed in the first wiring layer has a portion overlapping with the first capacitor pad and the second capacitor pad in plan view, the second internal wiring formed in the second wiring layer has a portion overlapping with the first capacitor pad and the second capacitor pad in plan view, the third internal wiring formed in the third wiring layer has a portion overlapping with the third capacitor pad and the fourth capacitor pad in plan view, and the fourth internal wiring formed in the fourth wiring layer has a portion overlapping with the third capacitor pad and the fourth capacitor pad in plan view, and the fourth internal wiring formed in the fourth wiring layer has a portion overlapping with the third capacitor pad and the fourth capacitor pad in plan view.

What is claimed is:

1. A semiconductor device comprising a wiring board, wherein the wiring board comprises:
   a first wiring;
   a first pad electrically connected to the first wiring;
   a second pad arranged to face the first pad and apart from the first pad;
   a second wiring electrically connected to the second pad; and
   a capacitive component connected to both the first pad and the second pad, the capacitive component including a parasitic inductance,
   wherein a characteristic impedance of the capacitive component is greater than a characteristic impedance of the first wiring and a characteristic impedance of the second wiring,
   wherein a characteristic impedance of the first pad is smaller than the characteristic impedance of the first wiring, and
   wherein a characteristic impedance of the second pad is smaller than the characteristic impedance of the second wiring.

2. The semiconductor device according to claim 1, wherein the first pad, the capacitive component, and the second pad constitute a band-pass filter.

3. The semiconductor device according to claim 1, wherein the characteristic impedance of a system in which the first pad, the capacitive component, and the second pad are combined is closer to the characteristic impedance of the first wiring than the characteristic impedance of the first pad.

4. The semiconductor device according to claim 1, wherein the characteristic impedance of a system in which the first pad, the capacitive component, and the second pad are combined is closer to the characteristic impedance of the second wiring than the characteristic impedance of the second pad.

5. The semiconductor device according to claim 1, wherein the characteristic impedance of the first wiring and the characteristic impedance of the second wiring are equal to each other.

6. The semiconductor device according to claim 1, wherein the capacitive component has a function of blocking a DC component.

7. The semiconductor device of claim 1, wherein the capacitive component is a chip capacitor.

8. The semiconductor device according to claim 1, wherein the wiring board has:
   a first structural part connected to both the first pad and the first wiring, and provided between the first pad and the first wiring, and
   a second structural part connected to both the second pad and the second wiring, and provided between the second pad and the second wiring.

9. The semiconductor device according to claim 8, wherein the characteristic impedance of the first structural part is greater than the characteristic impedance of the first wiring, and
   wherein the characteristic impedance of the second structural part is greater than the characteristic impedance of the second wiring.

10. The semiconductor device according to claim 8, wherein a first structural portion, the first pad, the capacitive component, the second pad, and a second structural portion constitute a band pass filter.

11. A semiconductor device comprising a wiring board, wherein the wiring board comprises:
   a first wiring;
   a first pad connected to the first wiring;
   a second pad arranged to face the first pad and apart from the first pad;
   a second wiring connected to the second pad; and
   a capacitive component connected to both the first pad and the second pad, and the capacitive component including a parasitic inductance,
   wherein each of the first wiring and the second wiring extending in a first direction and having a width of the first pad in a second direction orthogonal to the first direction is not less than twice and not more than four times the width of the capacitive component in the second direction, and
   wherein the width of the second pad in the second direction is not less than twice and not more than four times a width of the capacitive component in the second direction.

12. The semiconductor device according to claim 11, wherein the width of the first pad in the second direction is greater than a width of the first wiring in the second direction, and
   wherein the width of the second pad in the second direction is greater than a width of the second wiring in the second direction.

13. The semiconductor device according to claim 11, wherein the width of the first pad in the second direction is greater than a width of the first pad in the first direction, and
   wherein the width of the second pad in the second direction is greater than a width of the second pad in the first direction.

14. The semiconductor device according to claim 11, wherein a high-frequency signal is transmitted through the first wiring, and
   wherein the wiring board further comprises:
      a first structural portion connected to both the first pad and the first wiring and provided between the first pad and the first wiring; and
      a second structural portion connected to both the second pad and the second wiring and provided between the second pad and the second wiring.

15. The semiconductor device according to claim 14, wherein the wiring board comprises:
   a first wiring layer provided inside the wiring board;
   a second wiring layer provided inside the wiring board and provided on the first wiring layer;
   the first wiring provided on a surface of the wiring board above the second wiring layer;
   the first pad provided on the surface of the wiring board;
   the second pad provided on the surface of the wiring board;
   the second wiring provided on the surface of the wiring board;
   the first structure portion provided on the surface of the wiring board; and
   the second structure portion provided on the surface of the wiring board,
   wherein, in plan view, a first internal wiring formed in the first wiring layer has a portion overlapping with the first pad and the second pad, and
   wherein, in plan view, a second internal wiring formed in the second wiring layer does not overlap with the first pad and the second pad.

16. The semiconductor device according to claim 14, wherein the wiring board comprises:
   a first wiring layer provided inside the wiring board;
   a second wiring layer provided inside the wiring board and provided on the first wiring layer;
   the first wiring provided on a surface of the wiring board above the second wiring layer;
   the first pad provided on the surface of the wiring board;
   the second pad provided on the surface of the wiring board;
   the second wiring provided on the surface of the wiring board;
   the first structure portion provided on the surface of the wiring board; and
   the second structure portion provided on the surface of the wiring board,
   wherein, in plan view, a first internal wiring formed in the first wiring layer has a portion overlapping with the first pad and the second pad, and
   wherein, in plan view, a second internal wiring formed in the second wiring layer has a portion overlapping with the first pad and the second pad.

17. A semiconductor device comprising a wiring board, wherein the wiring board comprises:
   a first wiring through which a high-frequency signal is transmitted;
   a first pad electrically connected to the first wiring;
   a second pad arranged to face the first pad and apart from the first pad;
   a second wiring electrically connected to the second pad;
   a capacitive component connected to both the first pad and the second pad and the capacitive component including a parasitic inductance;
   a first structural portion connected to both the first pad and the first wiring and provided between the first pad and the first wiring; and
   a second structural portion connected to both the second pad and the second wiring and provided between the second pad and the second wiring,
   wherein the first structural portion is formed of a rectangular shape, and the second structural portion is also formed of a rectangular shape,
   wherein each of the first wiring and the second wiring extends in a first direction, wherein a width of the first structure portion in a second direction orthogonal to the first direction is smaller than a width of the first wiring in the second direction, and
wherein a width of the second structure portion in the second direction is smaller than a width of the second wiring in the second direction.

18. The semiconductor device according to claim 17, wherein the wiring board comprises:
   a first wiring layer provided inside the wiring board;
   a second wiring layer provided inside the wiring board and provided on the first wiring layer;
   the first wiring provided on a surface of the wiring board above the second wiring layer;
   the first pad provided on the surface of the wiring board;
   the second pad provided on the surface of the wiring board;
   the second wiring provided on the surface of the wiring board;
   the first structure portion provided on the surface of the wiring board; and
   the second structure portion provided on the surface of the wiring board.

19. The semiconductor device according to claim 18, wherein, in plan view, a first internal wiring formed in the first wiring layer has a portion overlapping with the first pad and the second pad, and
wherein, in plan view, a second internal wiring formed in the second wiring layer does not overlap with the first pad and the second pad.

20. The semiconductor device according to claim 18, wherein, in plan view, a first internal wiring formed in the first wiring layer has a portion overlapping with the first pad and the second pad, and
wherein, in plan view, a second internal wiring formed in the second wiring layer has a portion overlapping with the first pad and the second pad.

* * * * *